United States Patent
Lee et al.

(10) Patent No.: US 11,362,067 B2
(45) Date of Patent: Jun. 14, 2022

(54) METHODS OF MANUFACTURING SEMICONDUCTOR DEVICES

(71) Applicant: Samsung Electronics Co., Ltd., Suwon-si (KR)

(72) Inventors: Kyuha Lee, Seongnam-si (KR); Pilkyu Kang, Hwaseong-si (KR); Seokho Kim, Hwaseong-si (KR); Hoonjoo Na, Seoul (KR); Kwangjin Moon, Hwaseong-si (KR); Jaehyung Park, Anyang-si (KR); Joohee Jang, Hwaseong-si (KR); Yikoan Hong, Yongin-si (KR)

(73) Assignee: Samsung Electronics Co., Ltd.

( * ) Notice: Subject to any disclaimer, the term of this patent is extended or adjusted under 35 U.S.C. 154(b) by 7 days.

(21) Appl. No.: 16/855,352

(22) Filed: Apr. 22, 2020

(65) Prior Publication Data

US 2021/0066250 A1   Mar. 4, 2021

(30) Foreign Application Priority Data

Aug. 26, 2019 (KR) .......................... 10-2019-0104647

(51) Int. Cl.
*H01L 25/065* (2006.01)
*H01L 23/00* (2006.01)

(52) U.S. Cl.
CPC .......... *H01L 25/0657* (2013.01); *H01L 24/03* (2013.01); *H01L 24/05* (2013.01); *H01L 24/80* (2013.01); *H01L 2224/0345* (2013.01); *H01L 2224/03452* (2013.01); *H01L 2224/80001* (2013.01)

(58) Field of Classification Search
CPC ....... H01L 2224/80986; H01L 2224/94; H01L 25/0657; H01L 25/065
See application file for complete search history.

(56) References Cited

U.S. PATENT DOCUMENTS

| | | | |
|---|---|---|---|
| 6,376,363 B1 | 4/2002 | Iguchi | |
| 6,461,225 B1 | 10/2002 | Misra et al. | |
| 6,903,434 B2 * | 6/2005 | Shrivastava | ...... H01L 21/76202 257/499 |
| 6,924,236 B2 | 8/2005 | Yano et al. | |
| 6,979,625 B1 | 12/2005 | Woo et al. | |
| 7,169,664 B2 | 1/2007 | Preusse et al. | |
| 8,647,983 B2 | 2/2014 | Di Cioccio et al. | |
| 9,027,821 B2 | 5/2015 | Di Cioccio et al. | |
| 9,620,385 B2 | 4/2017 | Rivoire et al. | |
| 9,761,561 B2 | 9/2017 | Rajoo et al. | |

(Continued)

FOREIGN PATENT DOCUMENTS

| | | | |
|---|---|---|---|
| JP | 5187284 B2 | 4/2013 | |
| JP | 5640083 B2 | 12/2014 | |

*Primary Examiner* — Dale E Page
*Assistant Examiner* — Wilner Jean Baptiste
(74) *Attorney, Agent, or Firm* — Myers Bigel, P.A.

(57) ABSTRACT

A method of manufacturing a semiconductor device according to example embodiments includes: sequentially forming first through third insulating layers on a substrate; forming an opening by etching the first through third insulating layers; forming a conductive layer configured in the opening; forming a fourth insulating layer in the opening after the forming of the conductive layer; and removing a portion of an edge region of the substrate after the forming of the fourth insulating layer.

20 Claims, 24 Drawing Sheets

(56) References Cited

U.S. PATENT DOCUMENTS

| | | |
|---|---|---|
| 2017/0062366 A1 | 3/2017 | Enquist |
| 2018/0005978 A1 | 1/2018 | Edelstein et al. |
| 2019/0096800 A1* | 3/2019 | Wei .................. H01L 21/76843 |
| 2019/0096842 A1 | 3/2019 | Fountain, Jr. et al. |

* cited by examiner

METHODS OF MANUFACTURING SEMICONDUCTOR DEVICES

CROSS-REFERENCE TO RELATED APPLICATION

This application claims the benefit of Korean Patent Application No. 10-2019-0104647, filed on Aug. 26, 2019, in the Korean Intellectual Property Office, the disclosure of which is incorporated herein in its entirety by reference.

BACKGROUND

The present disclosure relates to methods of manufacturing semiconductor devices. Wafer-to-wafer bonding is often used for wafer-level three dimensional (3D) packaging. Recently, various techniques for manufacturing a 2.5D or 3D integrated circuit (IC) package (also called a wafer stack) by combining different kinds of wafers or wafers in which different kinds of semiconductor devices are implemented have been studied. After the wafer stack is formed, a back grinding process may be performed on at least one of the wafers that are generally bonded. The back grinding process may reduce thicknesses of the wafers in the wafer stack, enable high density packaging of the IC, and in some cases, expose bonding wirings for subsequent processes.

A process of removing a portion of an edge of a wafer ahead of the back grinding process is called an edge trimming process. Through the edge trimming process, chipping or breaking on the edge of the wafer during the back grinding or bumping process may be inhibited/prevented. However, the conventional wafer trimming process has an issue that bonding electrodes may be damaged by a cleaning process that is performed immediately after the trimming process, and thus, the reliability and yield of the wafer stack may be reduced.

SUMMARY

The inventive concept provides a method of manufacturing a semiconductor device with high reliability.

The issues to be solved by the technical idea of the inventive concept are not limited to the above-mentioned issues, and other matters not mentioned may be clearly understood by those of ordinary skill in the art from the following descriptions.

To solve the issues described above, according to example embodiments, a method of manufacturing a semiconductor device is provided. The manufacturing method includes: sequentially forming first through third insulating layers on a substrate; forming an opening by etching the first through third insulating layers; forming a conductive layer in the opening; forming a fourth insulating layer in the opening after the forming of the conductive layer; and removing a portion of an edge region of the substrate after the forming of the fourth insulating layer.

According to other example embodiments, a method of manufacturing a semiconductor device is provided. The manufacturing method includes: sequentially forming first through third insulating layers on a first surface of a first substrate; forming a plurality of openings by etching the first through third insulating layers; conformally forming a barrier conductive layer on the first through third insulating layers after the forming of the plurality of openings; forming a conductive layer in the plurality of openings and in contact with the barrier conductive layer; forming a conductive pattern by removing a portion of the conductive layer; forming a fourth insulating layer on the conductive pattern and the barrier conductive layer such that the fourth insulating layer is in contact with the conductive pattern and the barrier conductive layer, and a top surface of the fourth insulating layer is farther apart from the first substrate than a top surface of the third insulating layer; removing a portion of an edge region of the first substrate and cleaning the first substrate; performing a chemical mechanical polishing (CMP) process to expose a top surface of the conductive pattern; combining the first substrate with a second substrate; and grinding a second surface of the first substrate that is opposite the first surface of the first substrate.

According to other example embodiments, a method of manufacturing a semiconductor device is provided. The manufacturing method includes: providing a first back wiring structure to a first semiconductor structure including a first substrate; providing a first front wiring structure to a second semiconductor structure including a second substrate; and mounting the second semiconductor structure on the first semiconductor structure, wherein the providing of the first front wiring structure to the second semiconductor structure includes: forming first through third insulating layers on the second substrate; etching the first through third insulating layers to form first openings; forming a first barrier conductive layer and a first conductive layer in the first openings; forming first conductive patterns by removing a top portion of the first conductive layer; providing a fourth insulating layer on the first conductive patterns and the first barrier conductive layer; and performing a first trimming to remove a portion of an edge region of the second substrate.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
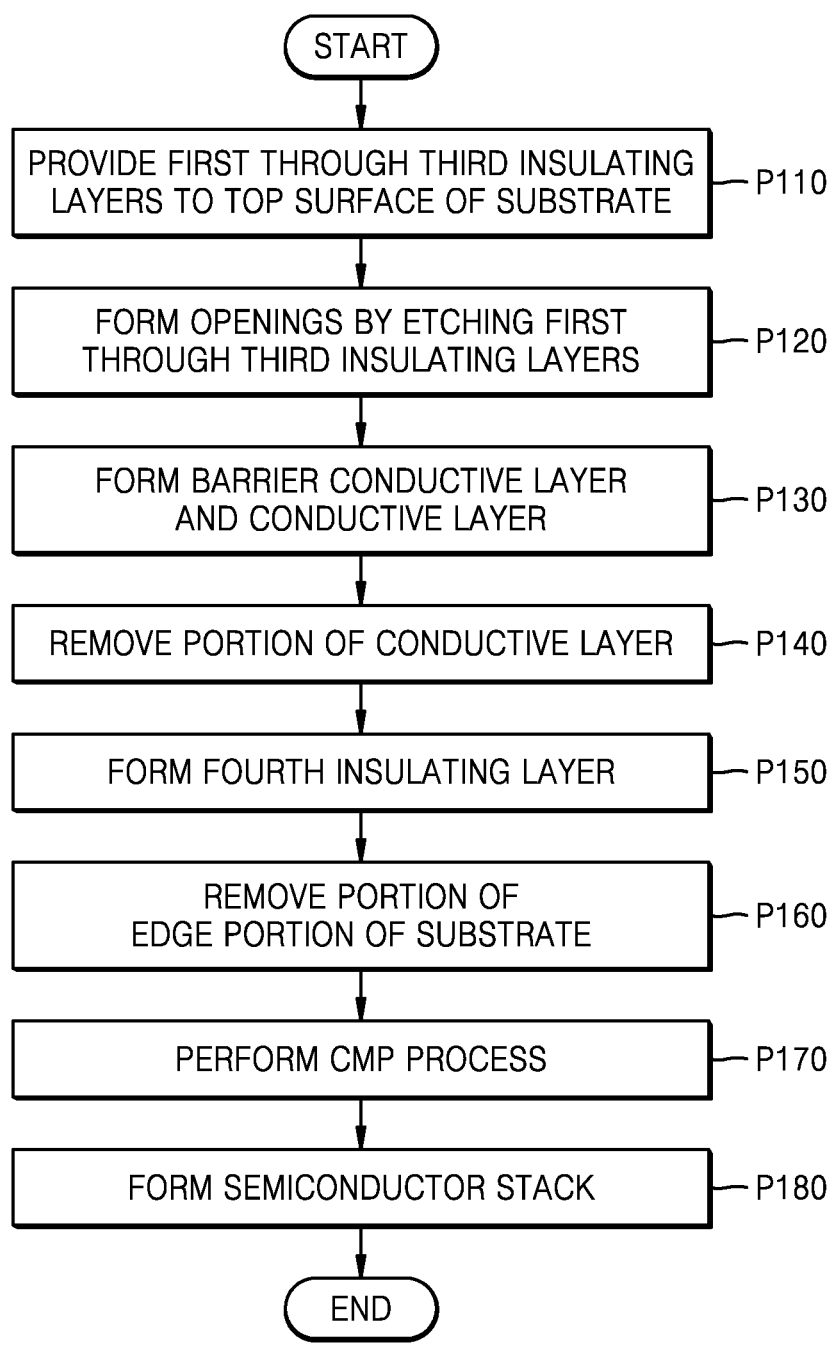
FIG. 1 is a flowchart of a method of manufacturing a semiconductor device, according to some embodiments.

Hereinafter, embodiments of the inventive concept will be described in detail with reference to the accompanying drawings. Identical reference numerals are used for the same constituent elements in the drawings, and duplicate descriptions thereof may be omitted. In the following drawings, a thickness or size of each layer may be exaggerated for convenience and clarity of description, and thus may differ from an actual shape or size ratio.

FIG. 1 is a flowchart of a method of manufacturing a semiconductor device, according to some embodiments.

Figure 2A:
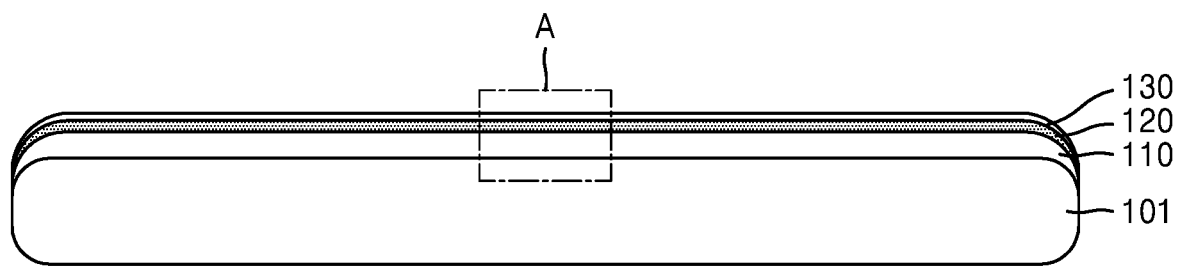
FIG. 2A is a schematic cross-sectional view illustrating a method of manufacturing a semiconductor device, according to some embodiments.
Figure 2B:
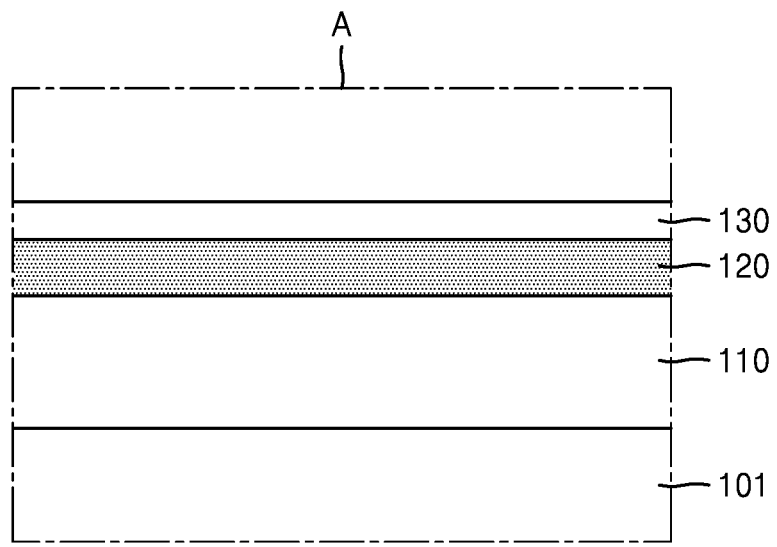
FIG. 2B is an enlarged partial cross-sectional view of a region in FIG. 2A.

FIG. 2A is a schematic cross-sectional view illustrating a method of manufacturing a semiconductor device, according to some embodiments, and FIG. 2B is an enlarged partial cross-sectional view of a region A in FIG. 2A.

Referring to FIGS. 1 through 2B, first through third insulating layers 110 through 130 may be provided on (e.g., on a top surface of) a substrate 101 (P110).

The substrate 101 may include, for example, silicon (Si). Alternatively, the substrate 101 may include a semiconductor element such as germanium (Ge), or a compound semiconductor such as silicon carbide (SiC), gallium arsenide (GaAs), and indium arsenide (InAs). Alternatively, the substrate 101 may have a silicon on insulator (SOI) structure. For example, the substrate 101 may include a buried oxide (BOX) layer. The substrate 101 may include a conductive region, for example, a well doped with impurities, or another structure doped with impurities. In addition, the substrate 101 may have various device isolation structures such as a shallow trench isolation (STI) structure. The substrate 101 may have a first surface that is an active surface and a second surface that is an inactive surface opposite to the first surface.

In FIG. 2A, an edge (e.g., edge region) of the substrate 101 is illustrated as having a round shape, but is not limited thereto. For example, the edge of the substrate 101 may have various shapes other than the round shape such as the shape of a beveled structure. The substrate 101 may substantially have a disc shape when viewed from above. The substrate 101 may include a notch for identifying a direction of the substrate 101. In some cases, the substrate 101 may further include an additional indicator to indicate a dopant type.

The first insulating layer 110 may be on the substrate 101. The first insulating layer 110 may be in contact with the substrate 101. The first insulating layer 110 may include an insulating material such as silicon oxide. According to some embodiments, the first insulating layer 110 may be formed by integrally stacking insulating material layers that are alternately stacked on each other in different processes. According to some embodiments, a wiring layer may be formed in the first insulating layer 110. Accordingly, the first insulating layer 110 may include a metal insulator metal (MIM) structure and may be formed by, for example, a back end of line (BEOL) process. In some cases, passive elements such as a capacitor may be further formed in the first insulating layer 110.

Various semiconductor devices may be formed in the substrate 101, or across the substrate 101 and the first insulating layer 110. The various semiconductor devices may include, for example, metal-oxide-semiconductor (MOS) field effect transistor (MOSFET) devices such as complementary MOS (CMOS) transistors, memory devices such as dynamic random access memory (RAM) (DRAM), phase change RAM (PRAM), spin transfer torque-magnetic RAM (STT-MRAM), resistive RAM (ReRAM), and flash memory devices, image sensors such as system large scale integration (LSI) and CMOS imaging sensor (CIS) devices, micro-electro-mechanical system (MEMS) devices, active devices, passive devices, and the like.

The second insulating layer 120 may be on the first insulating layer 110. The second insulating layer 120 may be in contact with the first insulating layer 110. The second insulating layer 120 may include a different material from the first insulating layer 110. According to some embodiments, the second insulating layer 120 may include, for example, silicon carbide (SiC). According to some embodiments, the second insulating layer 120 may include, for example, silicon nitride (SiN). According to some embodiments, the second insulating layer 120 may include, for example, silicon carbonitride (SiCN).

The third insulating layer 130 may be on the second insulating layer 120. The third insulating layer 130 may be in contact with the second insulating layer 120. The third insulating layer 130 may include a different material from the second insulating layer 120. The third insulating layer 130 may include the same material as the first insulating layer 110, but is not limited thereto. The third insulating layer 130 may include an insulating material such as silicon oxide.

FIGS. 3 through 6 are cross-sectional views illustrating a method of manufacturing a semiconductor device, according to some embodiments, each of which is a partial cross-sectional view corresponding to FIG. 2B.

Figure 3:
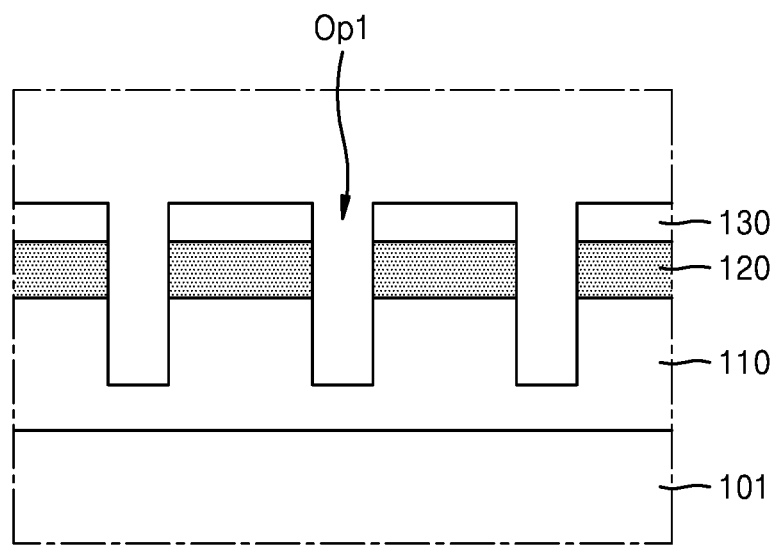
FIGS. 3 through 6 are cross-sectional views illustrating a method of manufacturing a semiconductor device, according to some embodiments, each of which is a partial cross-sectional view corresponding to FIG. 2B.

Referring to FIGS. 1 and 3, a plurality of openings Op1 may be formed by etching the first through third insulating layers 110 through 130 (P120).

The plurality of openings Op1 may be formed by, for example, dry etching, but are not limited thereto. FIGS. 3 through 6 are simplified views for convenience of description, and in some cases, the plurality of openings Op1 may have a tapered structure.

According to some embodiments, a depth of each of the plurality of openings Op1 may be less than a total height of a stack of the first through third insulating layers 110 through 130. Accordingly, the plurality of openings Op1 may not expose a top surface of the substrate 101.

Sidewalls of the plurality of openings Op1 may be defined by the first through third insulating layers 110 through 130, and bottom surfaces of the plurality of openings Op1 may be defined by the first insulating layer 110.

Figure 4:
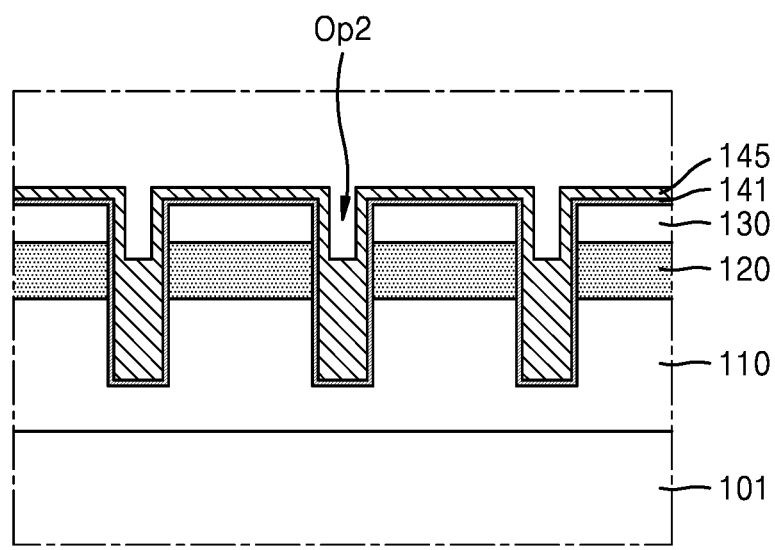

Referring to FIGS. 1 and 4, a barrier conductive layer 141 and a conductive layer 145 may be formed (P130).

The barrier conductive layer 141 may be in contact with the first to third insulating layers 110 through 130. The barrier conductive layer 141 may have a conformal shape. Accordingly, a shape of the plurality of openings Op1 in FIG. 3 may be transferred to the barrier conductive layer 141.

The barrier conductive layer 141 may include a conductive material. According to some embodiments, the barrier conductive layer 141 may include a metal material. According to some embodiments, the barrier conductive layer 141 may include titanium nitride (TiN), tantalum nitride (TaN), titanium aluminide (TiAl), titanium aluminum carbide (TiAlC), or the like.

The conductive layer 145 may be formed on the barrier conductive layer 141. The conductive layer 145 may be in contact with the barrier conductive layer 141. The conductive layer 145 includes a conductive material. According to some embodiments, the conductive layer 145 may include a metal material. According to some embodiments, the conductive layer 145 may include at least one of, for example, platinum (Pt), gold (Au), silver (Ag), iron (Fe), nickel (Ni), zinc (Zn), tin (Sn), aluminum (Al), lead (Pb), mercury (Hg), tungsten (W), and copper (Cu).

The conductive layer 145 may be in (e.g., may partially fill) the plurality of openings Op1 in FIG. 3, and accordingly, a plurality of openings Op2 may be formed. Bottom surfaces of the plurality of openings Op2 may be closer to the substrate 101 than to the top surface of the second insulating layer 120 which is in contact with the third insulating layer 130. Alternatively, the bottom surfaces of the plurality of openings Op2 may be farther from the substrate 101 than from the top surface of the second insulating layer 120.

Figure 5:
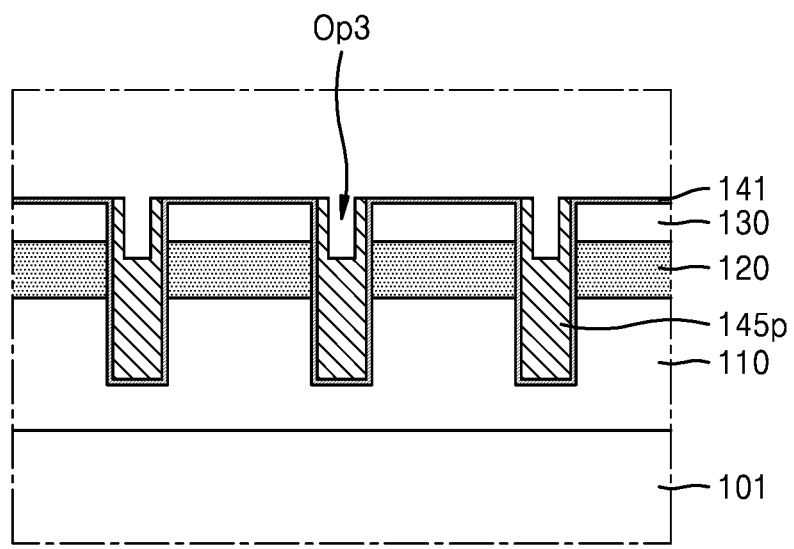

Referring to FIGS. 1, 4, and 5, a portion of the conductive layer 145 may be removed (P140).

A top portion of the conductive layer 145 may be removed by anisotropic etching, for example, such as a chemical-mechanical polishing (CMP) process. The CMP may be a CMP for targeting an etching amount (for example, an etching height) of the conductive layer 145. Accordingly, different portions of the conductive layers 145 corresponding to the plurality of openings Op2 may be separated from each other without substantial damage to the barrier conductive layer 141, and a plurality of conductive patterns (e.g., conductive regions) 145p may be formed.

Adjacent conductive patterns 145p may be apart from each other in a horizontal direction and may form separate electrical paths from each other. According to some embodiments, a portion of the conductive layer 145 may be removed by selective etching. Accordingly, in an operation of removing a portion of the conductive layer 145, the barrier conductive layer 141 may not be substantially removed.

Here, the horizontal direction may be a direction substantially parallel with the top surface of the substrate 101 (for example, a surface in contact with the first insulating layer 110), and a vertical direction may be a direction substantially perpendicular to the top surface of the substrate 101 (for example, a surface in contact with the first insulating layer 110).

Figure 6:
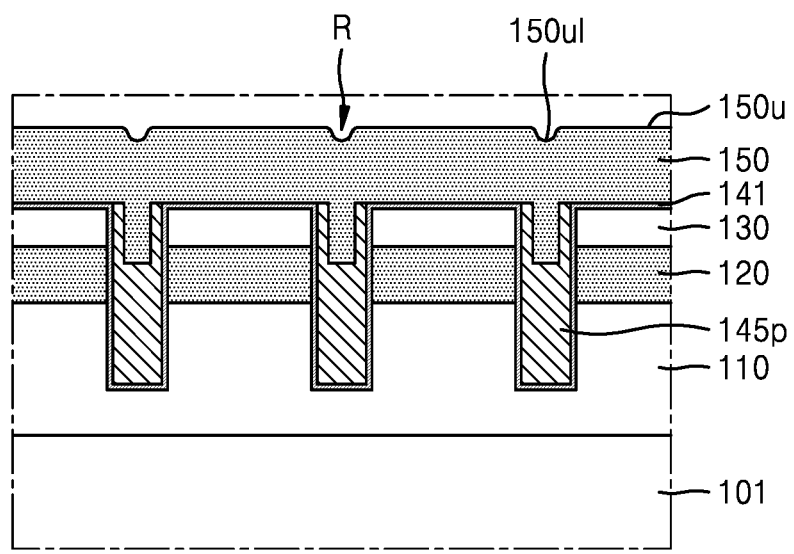

Referring to FIGS. 1 and 6, a fourth insulating layer 150 may be provided (P150).

The fourth insulating layer 150 may be provided in (e.g., to sufficiently fill) a plurality of openings Op3 in FIG. 5. For example, when vertical heights of the plurality of openings Op1 in FIG. 3 are about several tens of Angstroms, a thickness of the fourth insulating layer 150 may be about several hundred Angstroms. For example, when the vertical heights of the plurality of openings Op1 in FIG. 3 are about 20 Angstroms (Å), the thickness of the fourth insulating layer 150 may be about 200 Å to about 300 Å.

According to some embodiments, recesses R may be formed at respective positions corresponding to the plurality of openings Op3 in FIG. 5. According to some embodiments, the recesses R may vertically overlap the plurality of openings Op3 in FIG. 5. A portion 150$u$1, closest to the substrate 101, of a top surface 150$u$ of the fourth insulating layer 150 may be in the recess R. The portion 150$u$1, closest to the substrate 101, of the top surface 150$u$ of the fourth insulating layer 150 may be farther apart from the substrate 101 than a top surface of the third insulating layer 130.

The fourth insulating layer 150 may include an insulating material. According to some embodiments, the fourth insulating layer 150 may include at least one of SiN, SiC, and SiCN, and may be formed by, for example, chemical vapor deposition (CVD). In some embodiments, the fourth insulating layer 150 may include a material such as a spin on hardmask (SOH) and may be provided by a spin coating method. In some embodiments, the fourth insulating layer 150 may include a polymer or tetraethyl orthosilicate (TEOS). According to some embodiments, the fourth insulating layer 150 may include the same material as the second insulating layer 120. In some embodiments, the fourth insulating layer 150 may include a different material from the second insulating layer 120.

Figure 7A:
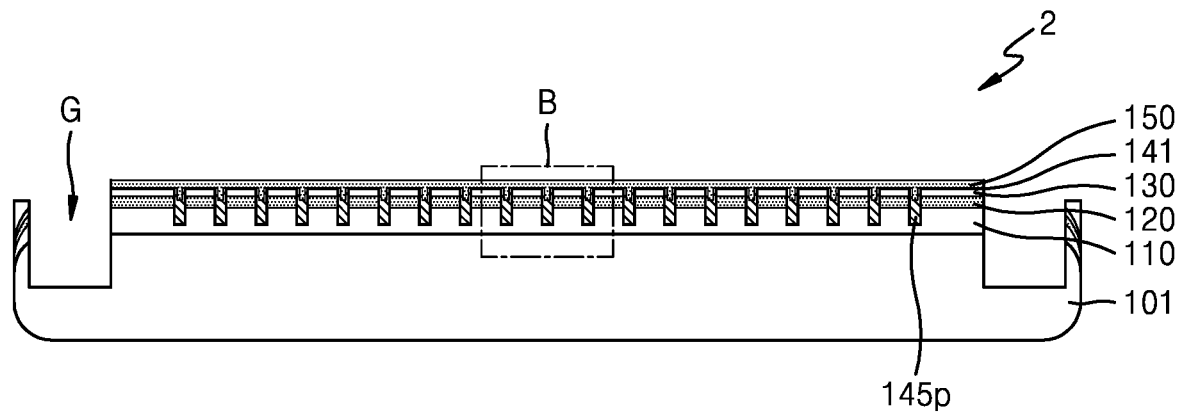
FIG. 7A is a schematic cross-sectional view illustrating a method of manufacturing a semiconductor device, according to some embodiments.
Figure 7B:
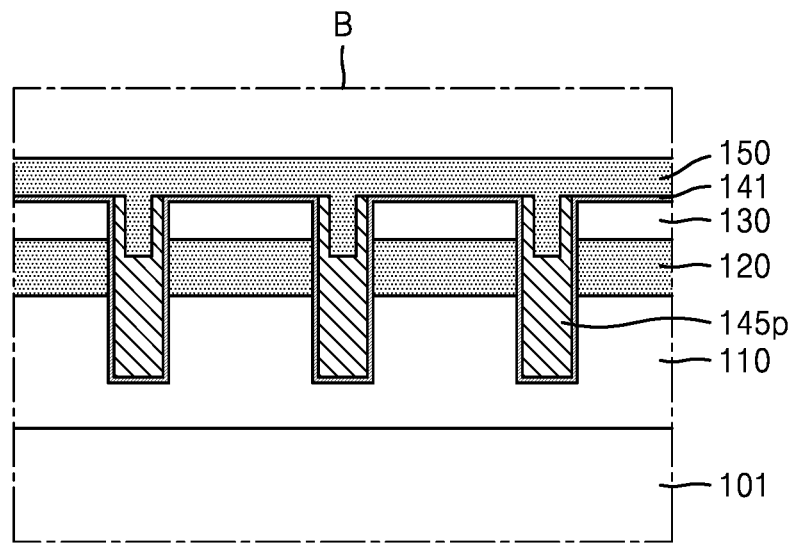
FIG. 7B is an enlarged partial cross-sectional view of a region in FIG. 7A.

FIG. 7A is a schematic cross-sectional view illustrating a method of manufacturing a semiconductor device, according to some embodiments, and FIG. 7B is an enlarged partial cross-sectional view of a region B in FIG. 7A.

Referring to FIGS. 1, 7A, and 7B, a portion (for example, a top portion) of an edge portion (e.g., edge region) of the substrate 101 may be removed (P160).

When the top portion of the edge portion of the substrate 101 is removed, the first through third insulating layers 110 through 130 and the fourth insulating layer 150 thereon may be partially removed together. As described above, a process of removing a portion of the edge portion of the substrate 101 may be called an edge trimming. As described later, in a process of forming the semiconductor stack (P180), a back grinding process may be performed to reduce a thickness of the substrate 101 with the semiconductor stack mounted thereon by grinding an inactive surface of the mounted substrate 101. During the back grinding process, edge chipping may occur at the edge portion of the substrate 101 due to influence of a side shape such as a round shape or a bevel shape of the substrate 101.

According to some embodiments, prior to the mounting operation of the substrate 101, by performing the edge trimming, the round shape of the side surface of the edge portion of the substrate 101 may be effectively removed. As a result, the edge chipping may be inhibited/prevented, and damage to the wafer may be inhibited/prevented.

A groove G may be formed at the edge portion of the substrate 101 by the edge trimming. The groove G may have a substantially straight sidewall and may have a substantially rectangular shape in a cross-sectional view. However, the groove G is not limited thereto, and the groove G may have an inverted triangular tapered structure, or may have an irregular shape or a square shape.

According to some embodiments, the groove G may be formed by using a dicing blade. According to some embodiments, the groove G may be formed by dry/wet etching. According to some embodiments, the groove G may be formed by irradiation of a laser beam. The groove G may be formed in a substantially ring shape along the circumference of the substrate 101.

Partially removing the edge portion of the substrate 101 may include cleaning the substrate 101, the first through third insulating layers 110 through 130, the barrier conductive layer 141, conductive patterns 145p, and the fourth insulating layer 150.

Here, for convenience of description, a structure in which the first through third insulating layers 110 through 130, the barrier conductive layer 141, the conductive patterns 145p, and the fourth insulating layer 150 are formed on the substrate 101 may be referred to as a second semiconductor structure 2.

According to some embodiments, the cleaning of the substrate 101 may be wet cleaning. According to some embodiments, the substrate 101 may be cleaned with, for example, an acid-base solution. According to some embodiments, the substrate 101 may be cleaned by using a HNPA solution. By cleaning with the HNPA solution, contaminants due to the edge trimming such as particles scattered from the substrate 101 (for example, Si particles) may be removed. Here, the HNPA solution may be a solution in which hydrofluoric acid (HF), nitric acid ($HNO_3$), phosphoric acid ($H_3PO_4$), acetic acid ($CH_3COOH$), and water are mixed in a certain volume ratio.

According to some embodiments, a top portion of the fourth insulating layer 150 may be removed by cleaning in the edge trimming operation without exposing the conductive patterns 145p. As a result, the fourth insulating layer 150 may be thinned while protecting the conductive patterns 145p. Accordingly, by cleaning in the edge trimming operation, the fourth insulating layer 150 may have a thickness less than a thickness of the fourth insulating layer (refer to 150 in FIG. 6) in a previous operation. In addition, the recesses R in FIG. 6 may be removed by cleaning in the edge trimming operation. According to some embodiments, since the fourth insulating layer 150 covers the conductive patterns 145p during the cleaning of the edge trimming operation, the conductive patterns 145p may not be exposed to the cleaning solution such as the HNPA solution. For example, during the cleaning, the fourth insulating layer 150 may extend continuously from a first of the conductive patterns 145p to a second and a third of the conductive patterns 145p.

In general, there has been an issue that the conductive patterns 145p including, for example, Cu may be damaged by HNPA cleaning that is performed immediately after the edge trimming. Accordingly, poor contact between mounted substrates and/or misalignment between conductive patterns for contacts may occur, due to damage of the conductive patterns. According to some embodiments herein, however, since the conductive patterns 145p are protected by the fourth insulating layer 150, the reliability and yield of manufacturing may be improved.

Figure 8:
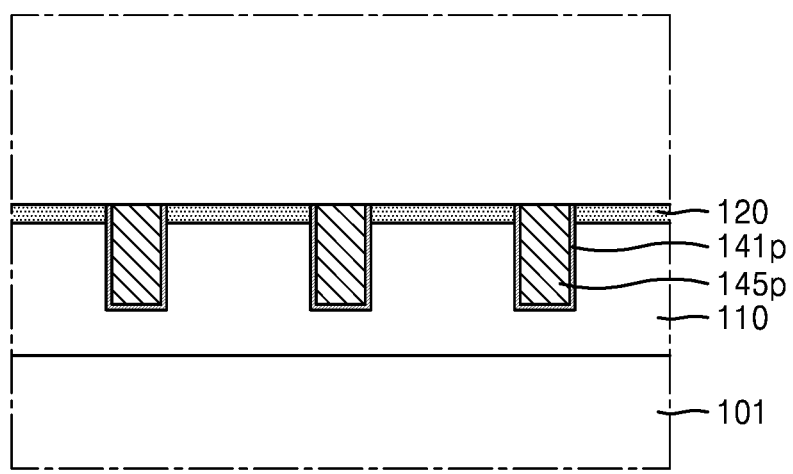
FIG. 8 is a partial cross-sectional view illustrating a method of manufacturing a semiconductor device, according to some embodiments.

FIG. 8 is a cross-sectional view illustrating a method of manufacturing the second semiconductor structure 2, according to some embodiments, and is a partial cross-sectional view corresponding to FIG. 7B.

Subsequently, referring to FIGS. 1 and 8, a CMP process may be performed (P170).

The fourth insulating layer (refer to 150 in FIG. 7B) may be removed by the CMP process. According to some embodiments, the CMP process may be performed with a target to remove the second insulating layer 120 by a certain (e.g., predetermined) amount. Accordingly, top portions of the third insulating layer (refer to 130 in FIG. 7B) and the second insulating layer 120 may be removed. According to some embodiments, the CMP process may have the top surface of the conductive patterns 145p as an end point.

The barrier conductive layer 141 may be separated by the CMP process, and a plurality of barrier conductive patterns 141p may be formed. Each barrier conductive pattern 141p may cover a side surface and a bottom surface of a corresponding conductive pattern 145p.

According to some embodiments, the substantial CMP process for the conductive patterns 145p may be omitted. Accordingly, the conductive patterns 145p may be protected/prevented from being excessively etched to cause dishing in the top profile thereof. In addition, the CMP process with a target to etch the second insulating layer 120 by a certain amount may have an improved uniformity compared with the conventional CMP process with a target to have the second insulating layer 120 as an end point, and thus wafer-to-wafer bonding may improve reliability. Furthermore, when the second insulating layer 120 and the fourth insulating layer (refer to 150 in FIG. 7B) include the same material, the fourth insulating layer including the same material may be etched while the second insulating layer 120 is etched by the CMP process, and thus reduction in the reliability of the CMP process due to the CMP process on heterogeneous materials may be inhibited/prevented.

Figure 9A:
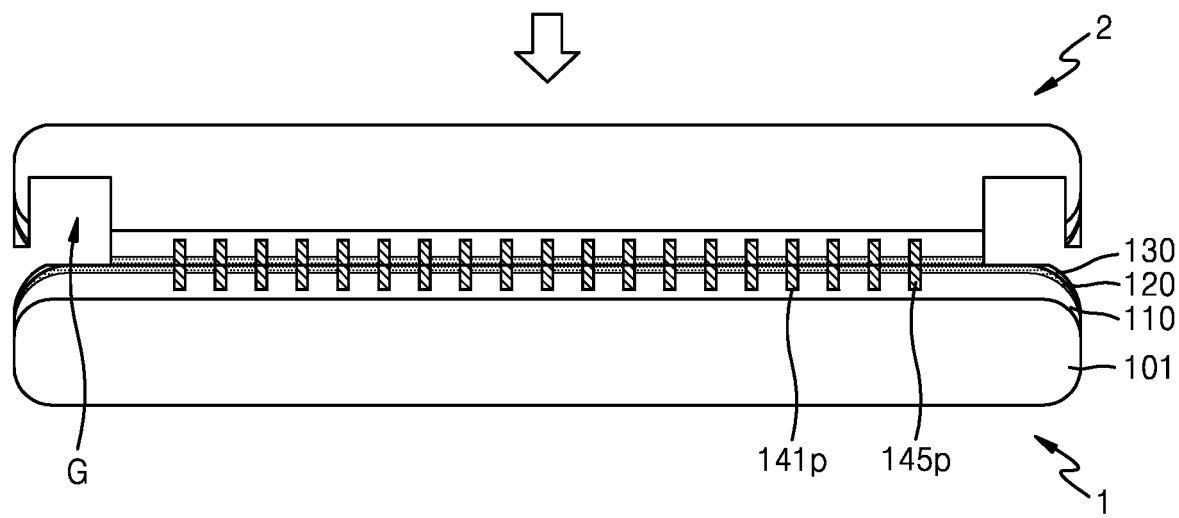
FIGS. 9A and 9B are cross-sectional views illustrating a method of manufacturing a semiconductor structure, according to some embodiments.
Figure 9B:
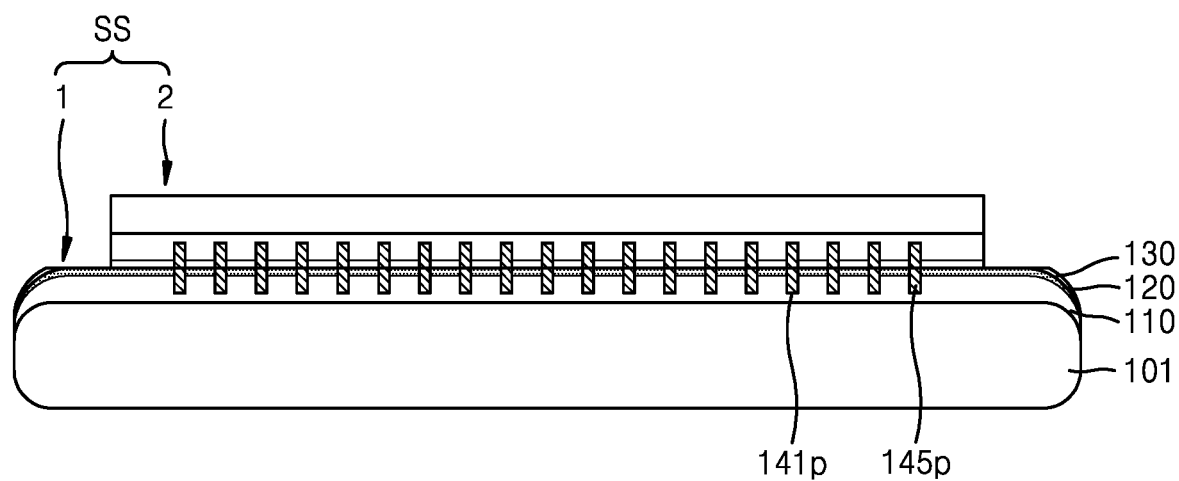

FIGS. 9A and 9B are cross-sectional views illustrating a method of manufacturing a second semiconductor structure 2, according to some embodiments.

Referring to FIGS. 1, 9A, and 9B, a semiconductor stack SS may be formed (P180).

The semiconductor stack SS may be formed by mounting the second semiconductor structure 2 on a first semiconductor structure 1 and bonding the first and second semiconductor structures 1 and 2 to each other. According to some embodiments, the second semiconductor structure 2 may be mounted on the first semiconductor structure 1 at a relatively low temperature, and the first and second semiconductor stacks 1 and 2 may be bonded to each other by annealing the semiconductor stack SS at a relatively high temperature. According to some embodiments, after the annealing process is completed, a thermo-compression process may be performed to strengthen the bond between the first and second semiconductor structures 1 and 2. According to some embodiments, an additional annealing process may be performed after the thermo-compression process. The first semiconductor structure 1 may be a result of the CMP process, described with reference to FIG. 8, performed on the second semiconductor structure 2 of FIG. 7A.

According to some embodiments, the first semiconductor structure 1 may be similar to the second semiconductor structure 2 except that no groove is formed in the edge portion of the first semiconductor structure 1. The first semiconductor structure 1 may include the substrate 101 and the first through third layers 110 through 130 sequentially stacked on the substrate 101. The second insulating layer 120 may be made coplanar with the conductive patterns 145p by the CMP process for exposing the conductive patterns 145p of the first semiconductor structure 1. The third insulating layer 130 may partially remain at the edge portion of the first semiconductor structure 1. After bonding the first and second semiconductor structures 1 and 2 to each other, the conductive patterns 145p of the first semiconductor structure 1 may be electrically connected to (e.g., may contact) the conductive patterns 145p of the second semiconductor structure 2.

The first semiconductor structure 1 may include MOSFET devices such as CMOS transistors, memory devices such as DRAM, PRAM, STT-MRAM, ReRAM, and flash memory devices, image sensors such as system LSI and CIS devices, MEMS devices, active devices, passive devices, and the like. The first semiconductor structure 1 may include a semiconductor device different from the second semiconductor structure 2.

A thickness of the substrate 101 may be reduced by back grinding a back surface of the substrate 101 included in the second semiconductor structure 2. Accordingly, an edge portion outside the groove G of the second semiconductor structure 2 may be separated and removed due to the presence of the groove G.

Figure 10:
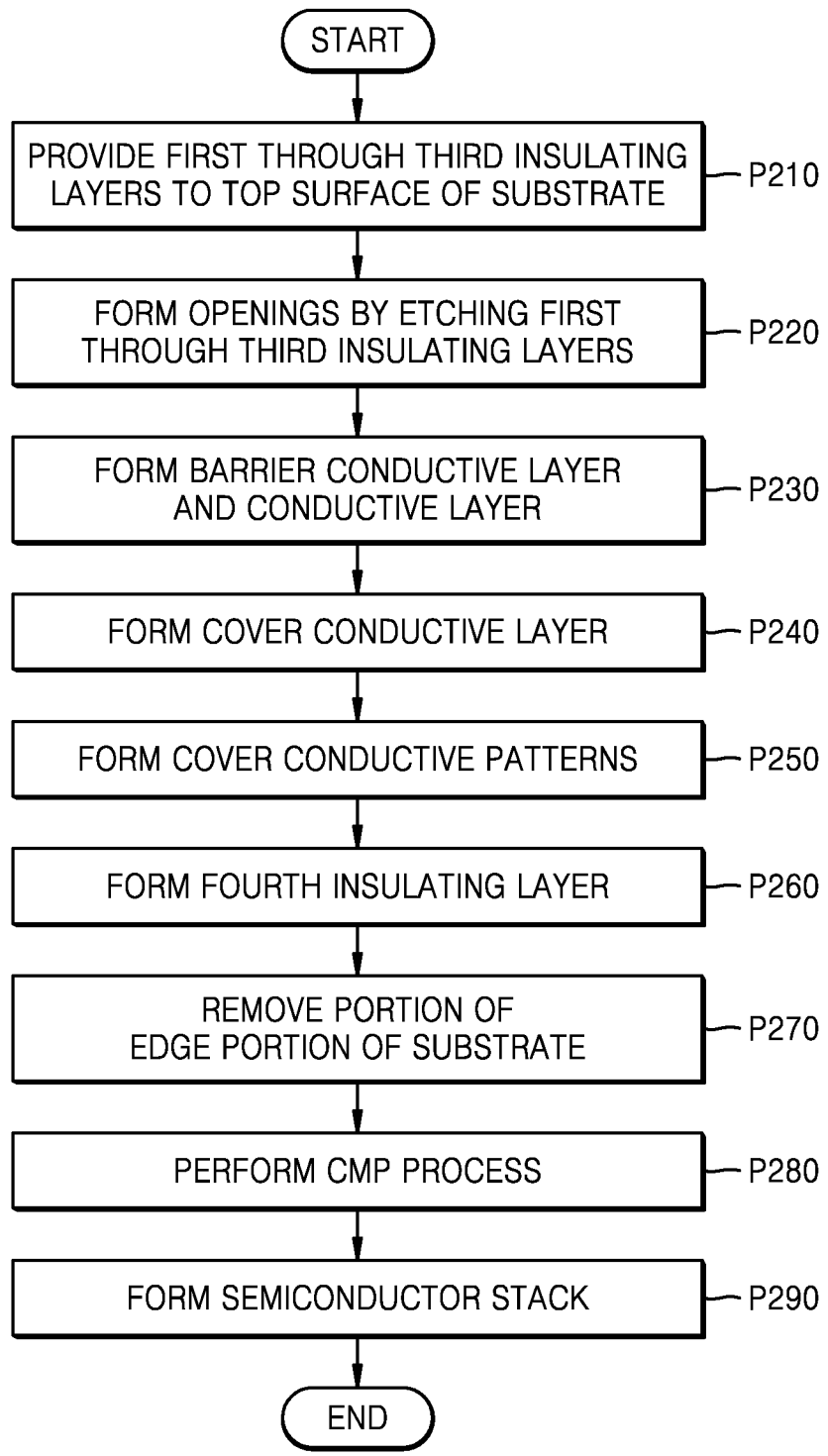
FIG. 10 is a flowchart of a method of manufacturing a semiconductor device, according to some embodiments.

FIG. 10 is a flowchart of a method of manufacturing a semiconductor device, according to some embodiments.

FIGS. 11 through 15B are cross-sectional views illustrating a method of manufacturing a semiconductor structure, according to some embodiments.

For convenience of description, duplicate descriptions given with reference to FIGS. 1 through 9B may be omitted and differences may be mainly described.

Referring to FIG. 10, operations P210 through P230 may be performed in substantially the same manner as operations P110 through P130 in FIG. 1.

Figure 11:
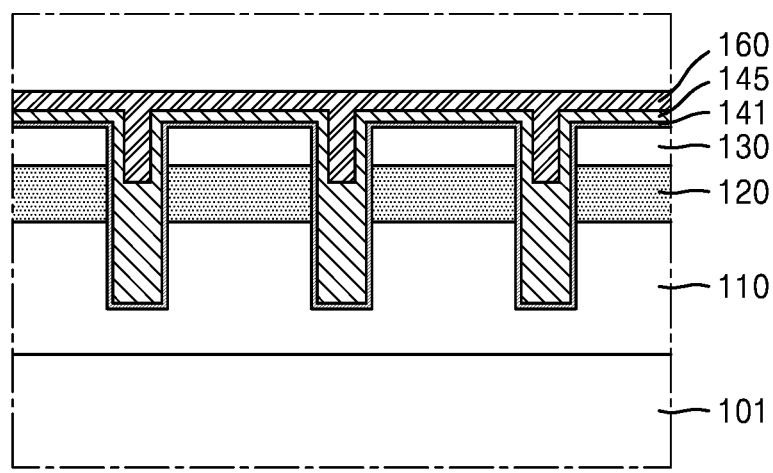
FIGS. 11 through 15B are cross-sectional views illustrating a method of manufacturing a semiconductor structure, according to some embodiments.

Next, referring to FIGS. 10 and 11, a covering conductive layer 160 contacting the conductive layer 145 may be formed (P240).

The covering conductive layer 160 may completely fill the plurality of openings Op2 in FIG. 4. According to some embodiments, the covering conductive layer 160 may include a conductive material. According to some embodiments, the covering conductive layer 160 may include a metal material. According to some embodiments, the covering conductive layer 160 may include one of, for example, Pt, Au, Ag, Fe, Ni, Zn, Sn, Al, Pb, Hg, W, and Cu, but is not limited thereto. According to some embodiments, the covering conductive layer 160 may include a different material from the conductive layer 145.

Figure 12:
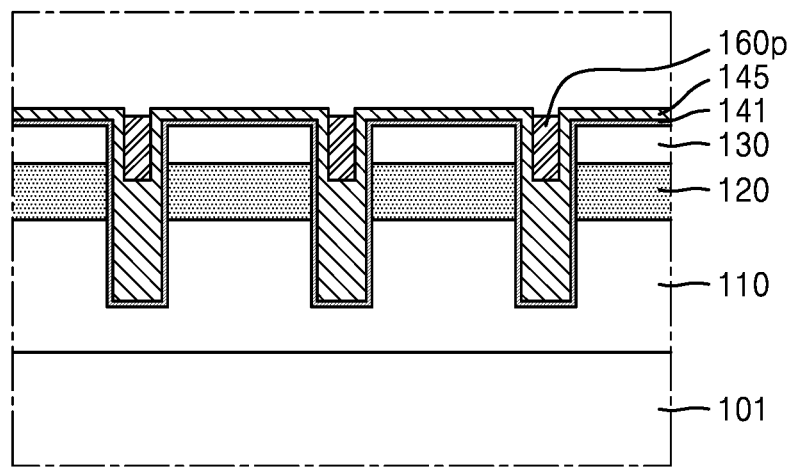

Referring to FIGS. 10 through 12, covering conductive patterns 160p may be formed (P250).

The covering conductive patterns 160p may be formed by partially removing the covering conductive layer 160. Partial removal of the covering conductive layer 160 may be selectively performed without substantial removal of the conductive layer 145 and the barrier conductive layer 141. Bottom surfaces and sidewalls of the covering conductive patterns 160p may be in contact with the conductive layer 145. According to some embodiments, top surfaces of the covering conductive patterns 160p are illustrated as being at a level lower than a top surface of the conductive layer 145, but are not limited thereto.

Figure 13:
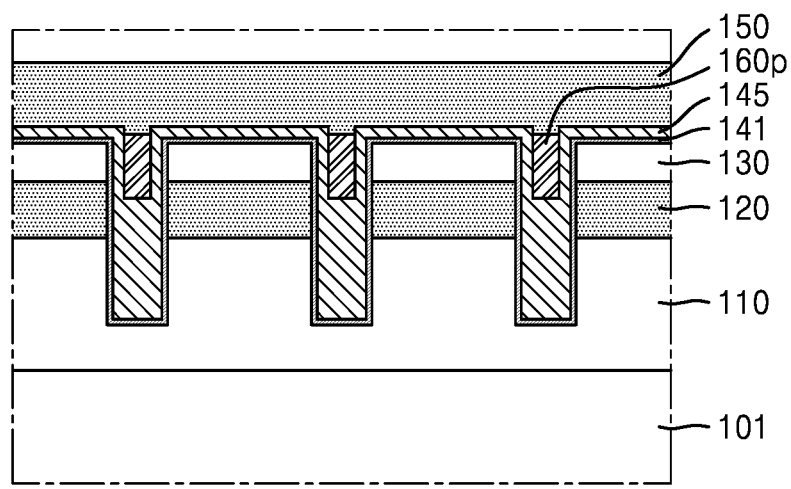

Referring to FIGS. 10 and 13, a fourth insulating layer 150 may be formed (P260).

Forming the fourth insulating layer 150 may be substantially the same as described with reference to FIGS. 1 and 6. The fourth insulating layer 150 may be in contact with the covering conductive patterns 160p and the conductive layer 145.

Figure 14:
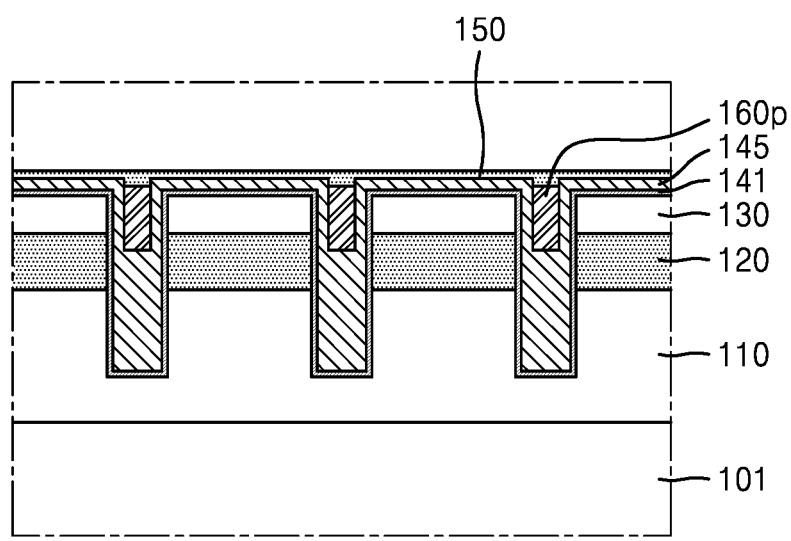

Subsequently, Referring to FIGS. 10 and 14, a portion of an edge portion of the substrate 101 may be removed (P270).

Removal of a portion of the edge portion of the substrate 101 may be substantially the same as described with reference to FIGS. 1, 7A, and 7B.

A portion of the fourth insulating layer 150 may be etched by cleaning in the edge trimming operation (P270). Accordingly, a vertical thickness of the fourth insulating layer 150 may be reduced.

Subsequently, referring to FIGS. 10, 15A, and 15B, a CMP process may be performed (P280).

Figure 15A:
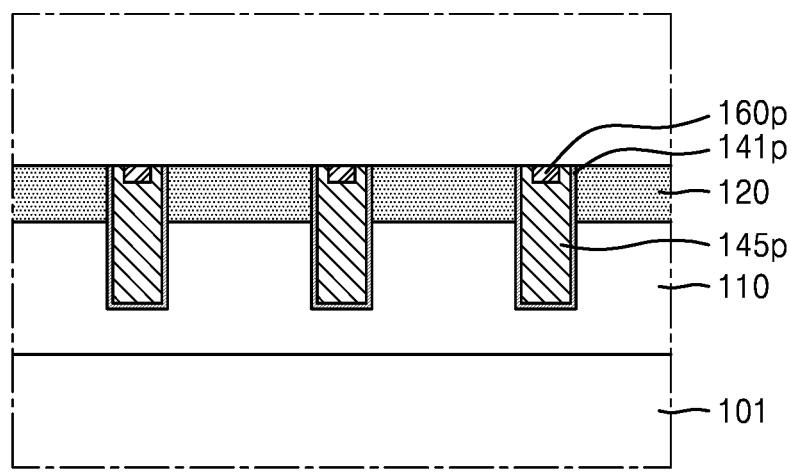

According to some embodiments, as illustrated in FIG. 15A, the CMP process may be performed such that the covering conductive patterns 160p remain on the barrier conductive patterns 141p. Accordingly, the second insulating layer 120, the barrier conductive patterns 141p, the conductive patterns 145p, and the covering conductive patterns 160p may be coplanar with each other.

Figure 15B:
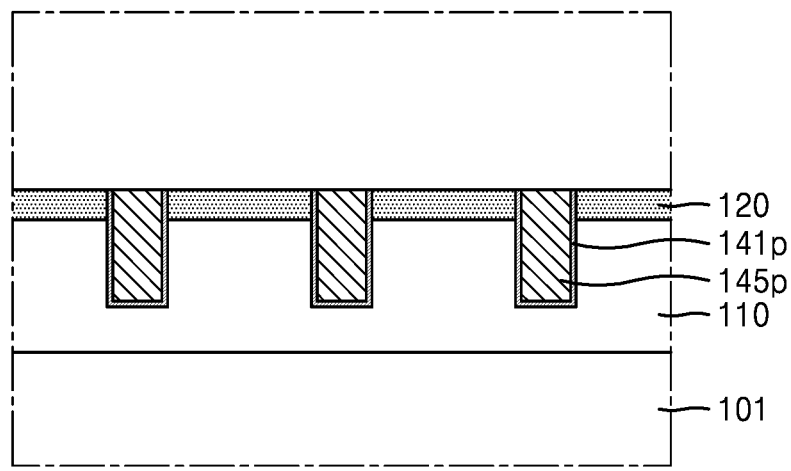

According to some embodiments, the CMP process may be performed such that the covering conductive patterns 160p are removed over the barrier conductive patterns 141p as illustrated in FIG. 15B. Accordingly, the second insulating layer 120, the barrier conductive patterns 141p, and the conductive patterns 145p may be coplanar with each other.

Subsequently, the semiconductor stack SS may be formed (P290). The forming of the semiconductor stack SS may be substantially the same as the description of operation P180 given with reference to FIGS. 1, 9A, and 9B.

Figure 16:
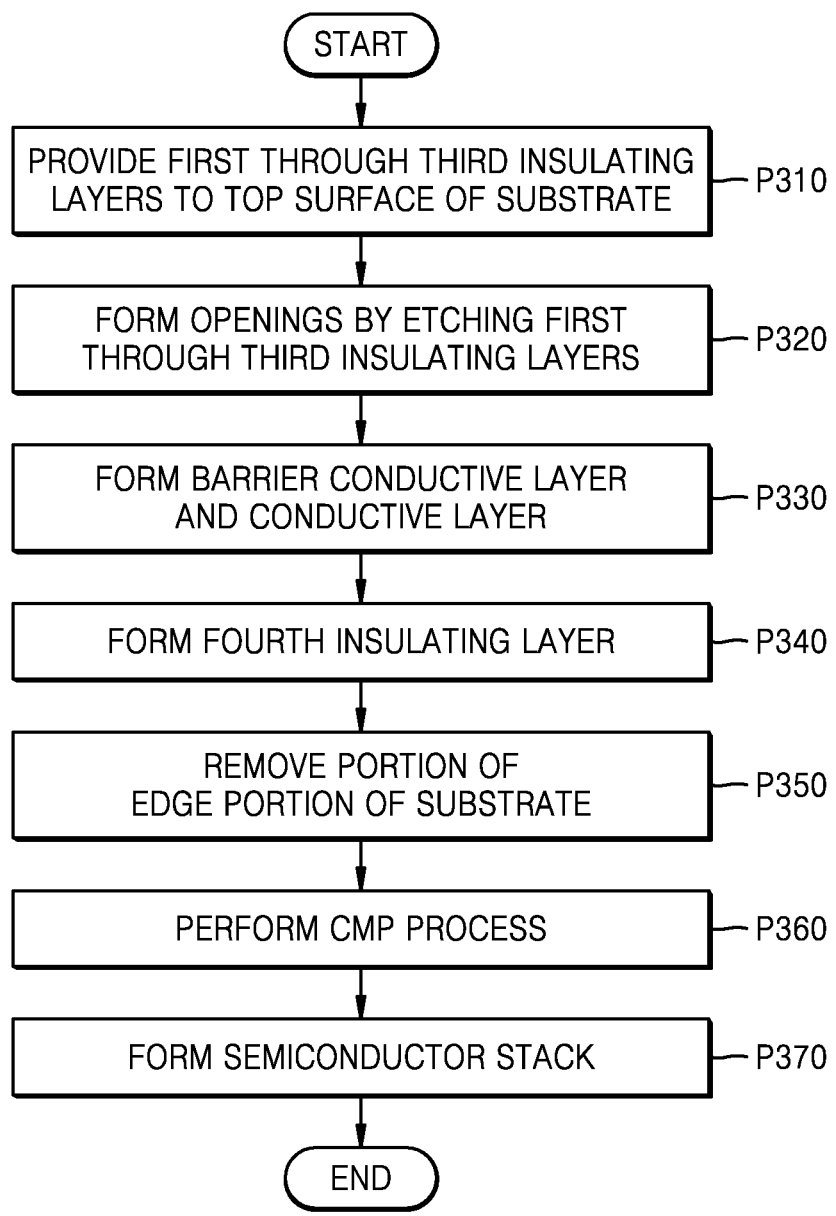
FIG. 16 is a flowchart of a method of manufacturing a semiconductor device, according to some embodiments.

FIG. 16 is a flowchart of a method of manufacturing a semiconductor device, according to some embodiments.

FIGS. 17 through 19C are cross-sectional views illustrating a method of manufacturing a semiconductor structure, according to some embodiments.

For convenience of description, duplicate descriptions given with reference to FIGS. 1 through 9B may be omitted and differences may be mainly described.

Referring to FIG. 16, operations P310 through P330 may be performed in substantially the same manner as operations P110 through P130 in FIG. 1.

Figure 17:
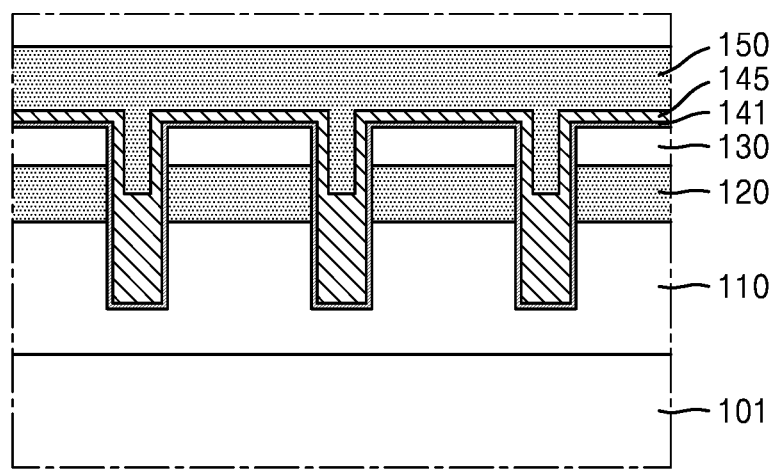
FIGS. 17 through 19C are cross-sectional views illustrating a method of manufacturing a semiconductor structure, according to some embodiments.

Referring to FIGS. 16 and 17, the fourth insulating layer 150 may be formed (P340).

Forming the fourth insulating layer 150 may be similar to descriptions given with reference to FIGS. 1 and 6.

However, unlike the descriptions given with reference to FIGS. 1 through 6, the fourth insulating layer 150 may be formed without removing a portion of the conductive layer 145. Accordingly, the fourth insulating layer 150 may be in contact with the conductive layer 145 and may fill the plurality of openings Op2 in FIG. 4. Accordingly, the top profile of the conductive layer 145 may be transferred to a bottom surface of the fourth insulating layer 150.

Figure 18:
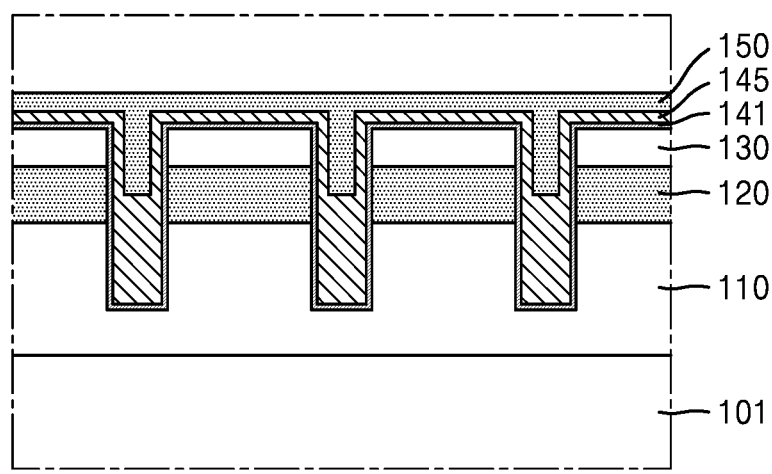

Subsequently, referring to FIGS. 16 and 18, a portion of the edge portion of the substrate 101 may be removed (P350).

Removal of a portion of the edge portion of the substrate 101 may be substantially the same as described with reference to FIGS. 1, 7A, and 7B. A portion of the fourth insulating layer 150 may be etched by cleaning in the edge trimming operation (P350). Accordingly, a vertical thickness of the fourth insulating layer 150 may be reduced.

Subsequently, referring to FIGS. 10, 19A, and 19C, a CMP process may be performed (P360).

Figure 19A:
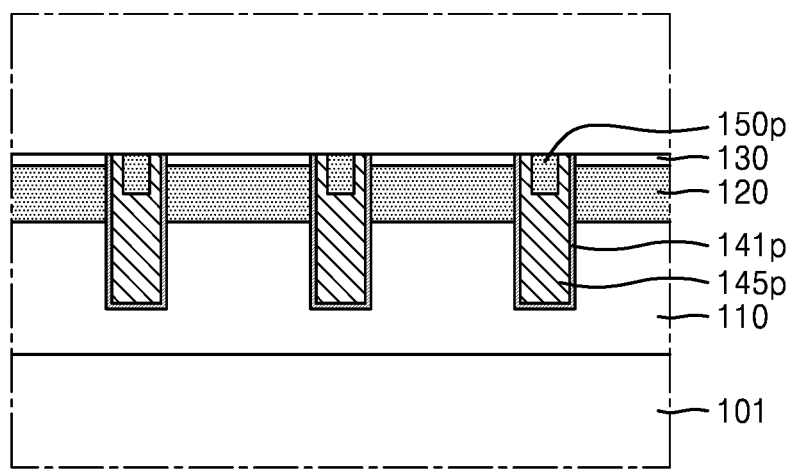

According to some embodiments, as illustrated in FIG. 19A, the CMP process may be performed such that an insulating pattern 150p and the third insulating layer 130 remain. Sidewalls and bottom surfaces of the insulating pattern 150p may be in contact with the conductive patterns 145p. The CMP process of FIG. 19A may be the CMP process with a target to etch a certain amount of the third insulating layer 130. Accordingly, top surfaces of the third insulating layer 130, the barrier conductive patterns 141p, the conductive patterns 145p, and insulating patterns 150p may be coplanar with each other.

Figure 19B:
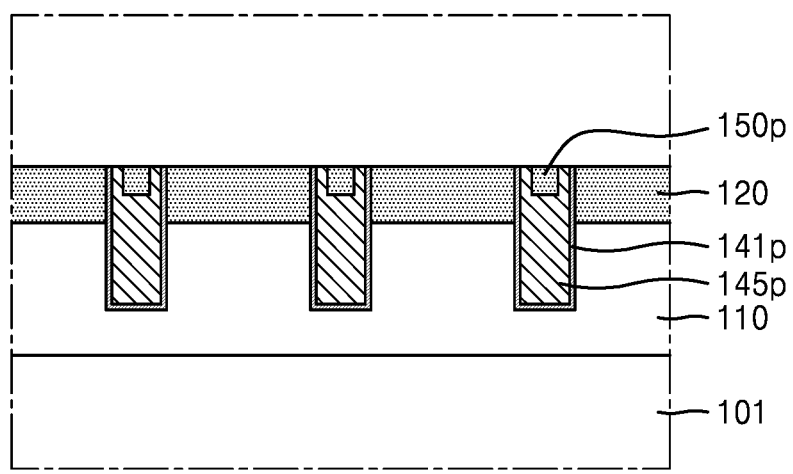
Figure 19C:
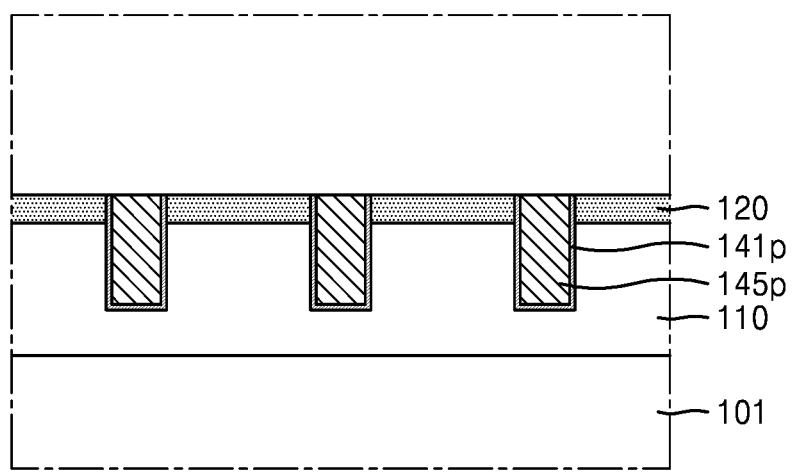

According to some embodiments, as illustrated in FIG. 19B, the CMP process may be performed such that the insulating patterns 150p remain on the barrier conductive patterns 141p. The CMP process of FIG. 19B may be the CMP process with a target to the etching amount of the second insulating layer 120. Accordingly, top surfaces of the second insulating layer 120, the barrier conductive patterns 141p, the conductive patterns 145p, and the insulating patterns 150p may be coplanar with each other.

According to some embodiments, as illustrated in FIG. 15B, after the CMP process is performed, the insulating patterns 150p on the barrier conductive patterns 141p may be removed. The CMP process of FIG. 19C may be the CMP process with a target to the etching amount of the second insulating layer 120. Accordingly, the second insulating layer 120, the barrier conductive patterns 141p, and the conductive patterns 145p may be coplanar with each other.

Figure 20:
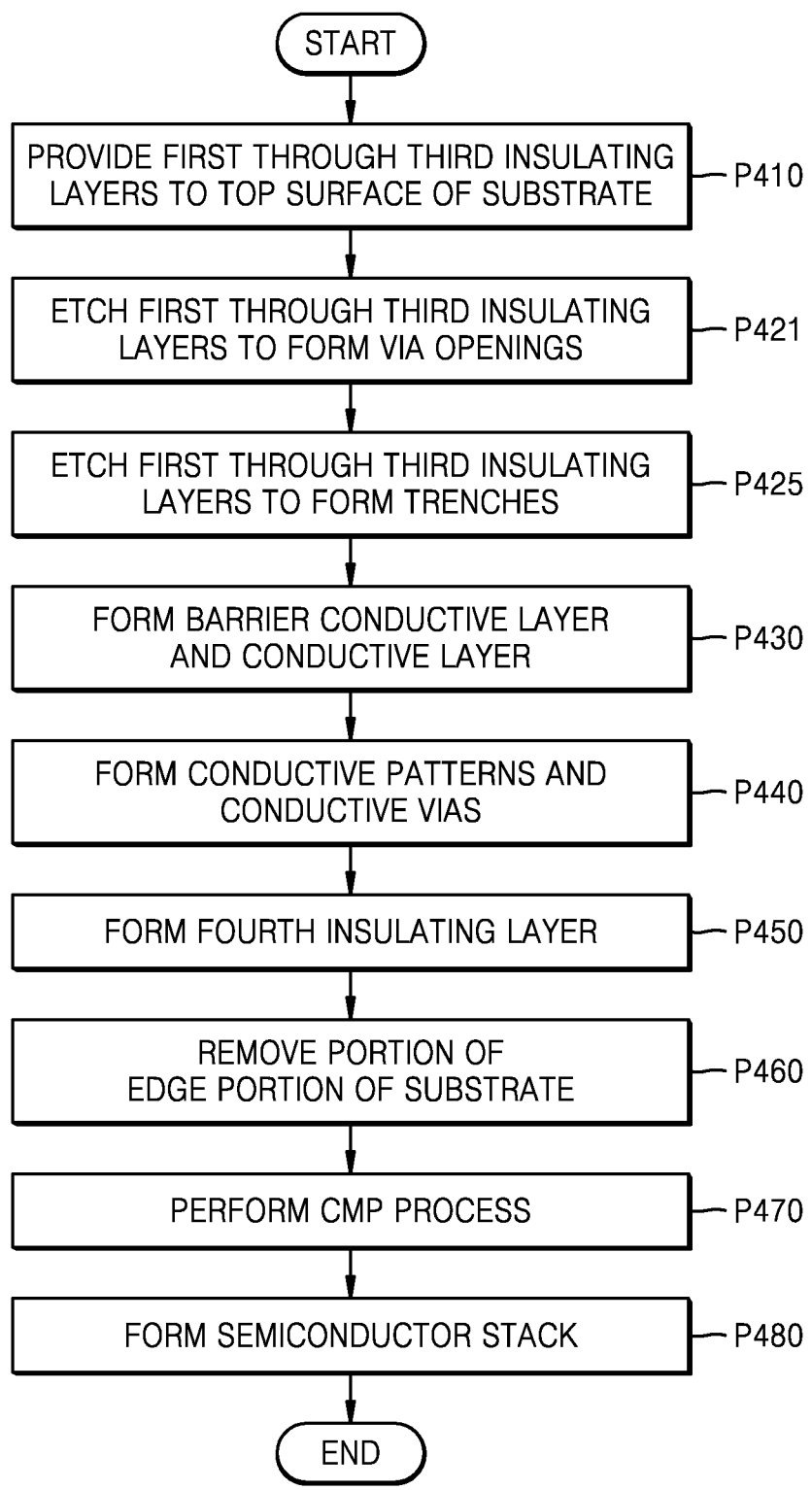
FIG. 20 is a flowchart of a method of manufacturing a semiconductor device, according to some embodiments.

FIG. 20 is a flowchart of a method of manufacturing a semiconductor device, according to some embodiments.

Figure 25:
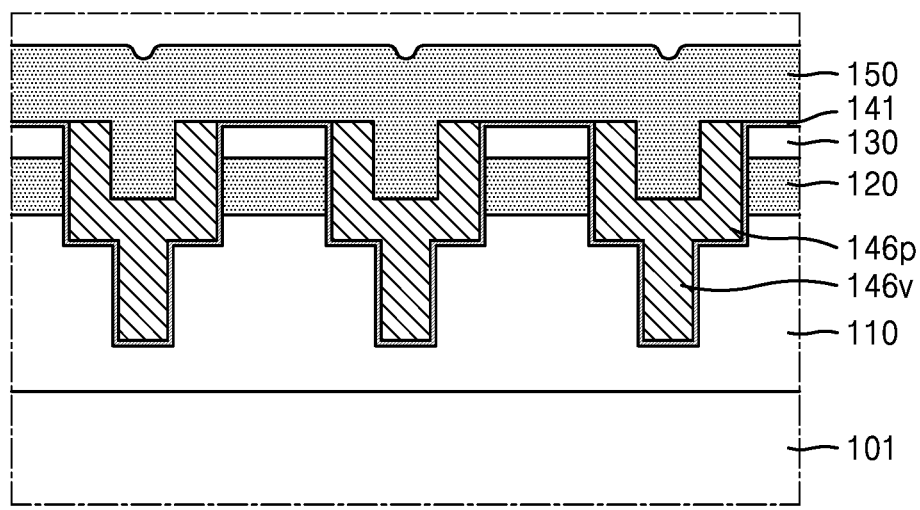
Figure 26A:
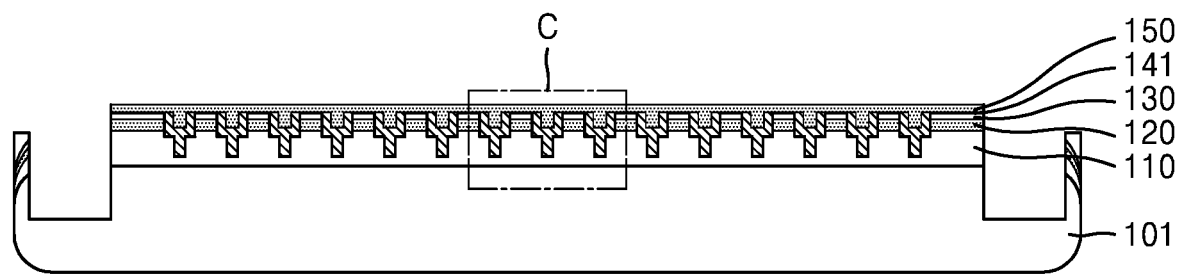
Figure 26B:
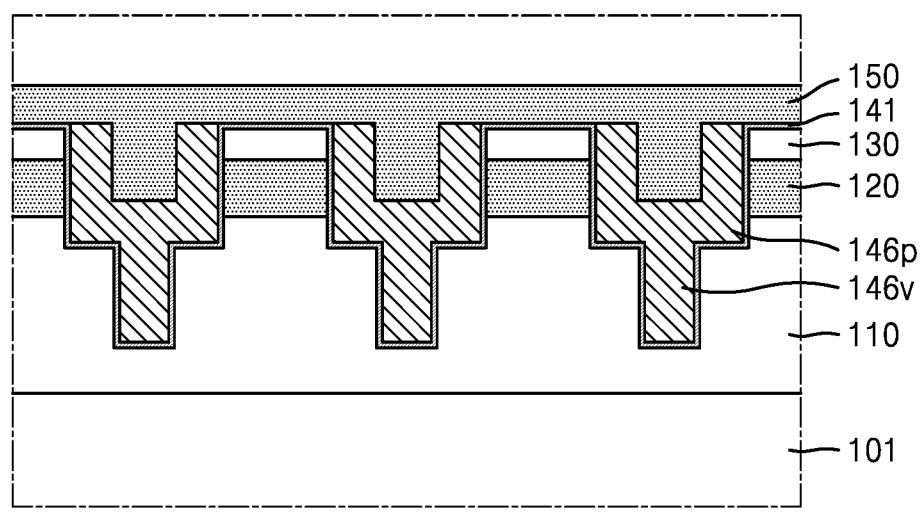
Figure 27A:
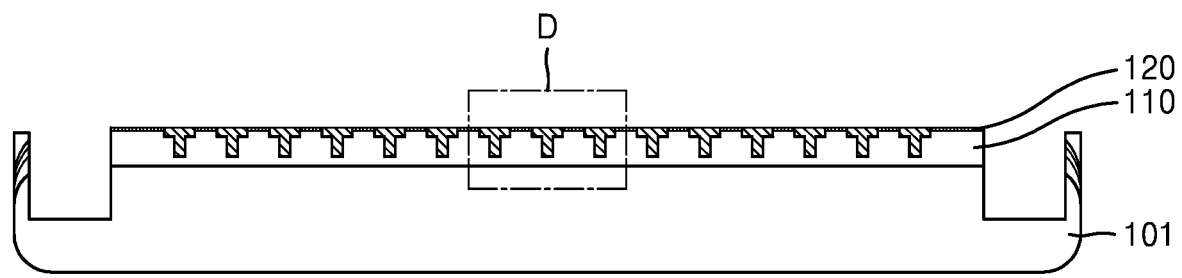
Figure 27B:
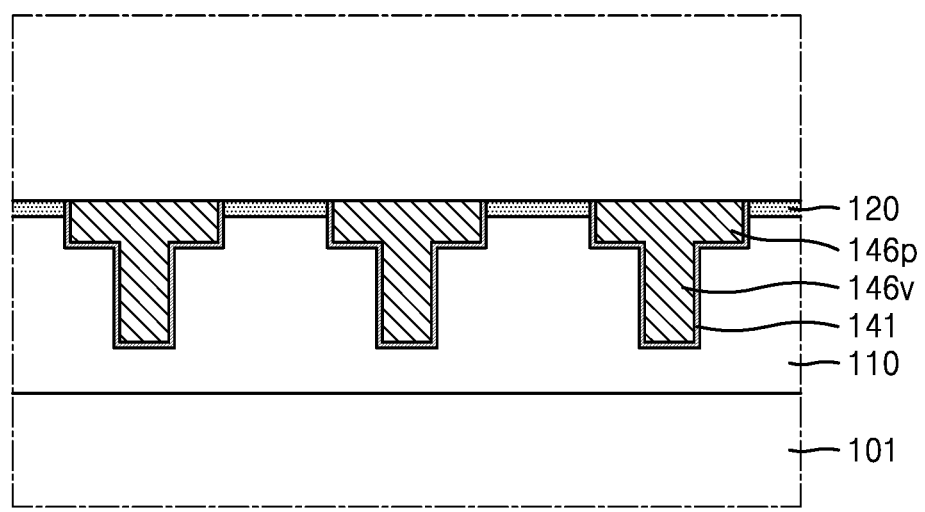

FIGS. 21 through 27B are cross-sectional views illustrating a method of manufacturing a semiconductor structure, according to some embodiments. FIGS. 21 through 25 are partial cross-sectional views corresponding to FIG. 2B, FIG. 26B is a partial cross-sectional view of an enlarged region C in FIG. 26A, and FIG. 27B is a partial cross-sectional view of an enlarged region D in FIG. 27A.

For convenience of description, duplicate descriptions given with reference to FIGS. 1 through 19C may be omitted and differences may be mainly described.

Operation P410 in FIG. 20 may be substantially the same as operation P110 in FIG. 1.

Figure 21:
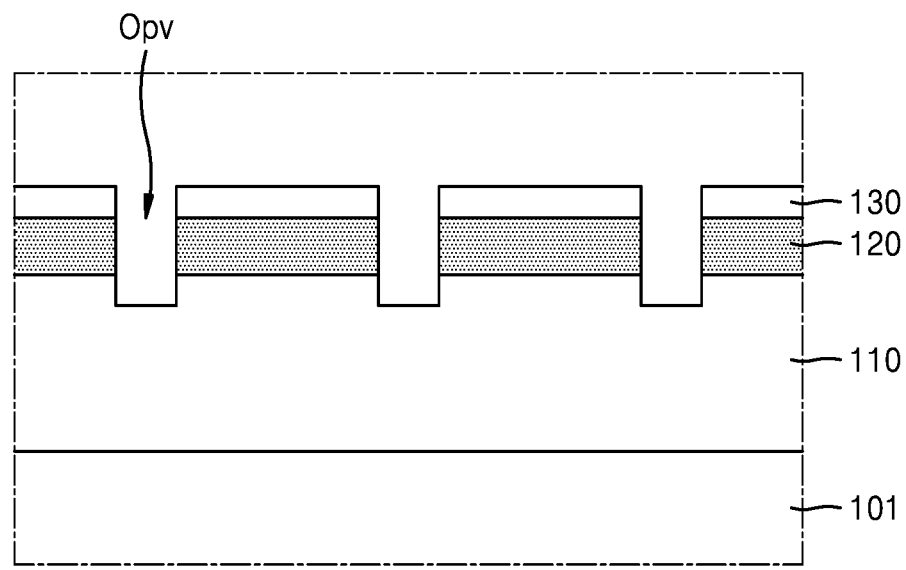
FIGS. 21 through 27B are cross-sectional views illustrating a method of manufacturing a semiconductor structure, according to some embodiments.

Referring to FIGS. 20 and 21, the first through third insulating layers 110 through 130 may be etched to form via openings Opv (P421).

The first through third insulating layers 110 through 130 may be etched by dry etching, for example, plasma etching, but are not limited thereto. The via openings Opv formed in the first through third insulating layers 110 through 130 may extend in a direction perpendicular to the top surface of the substrate 101.

Figure 22:
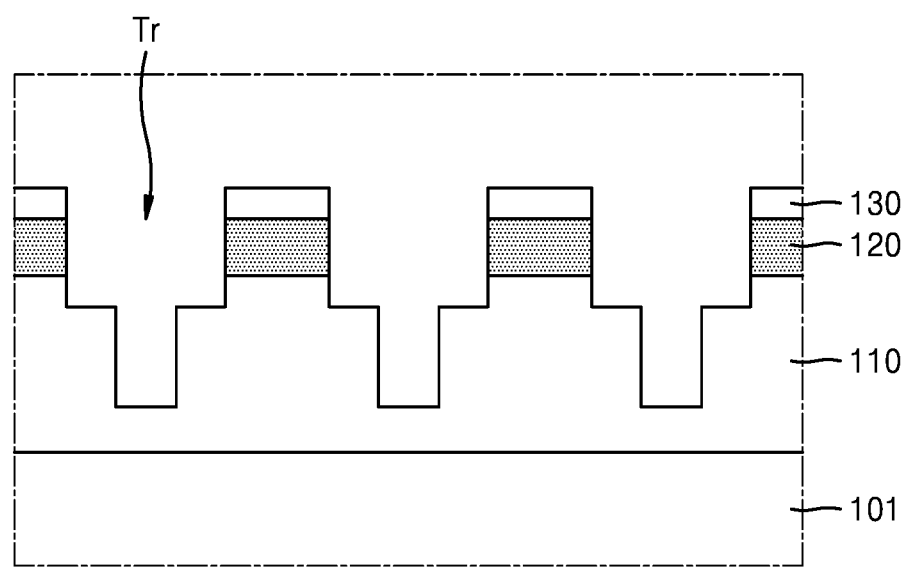

Referring to FIGS. 20 through 22, the first through third insulating layers 110 through 130 may be etched to form trenches Tr (P425).

As in operation P421, the first through third insulating layers 110 through 130 may be etched by dry etching such as plasma etching. The trenches Tr may be formed to overlap the via openings Opv, respectively. A portion of the first through third insulating layers 110 through 130 where the via opening Opv has been formed may be further etched in a direction perpendicular to the top surface of the substrate 101 in the process of forming the trenches Tr. Accordingly, a space for forming a conductive via (refer to 146v in FIG. 24) to be described later and a space for forming the conductive pattern (refer to 146p in FIG. 24) may be substantially simultaneously formed.

Figure 23:
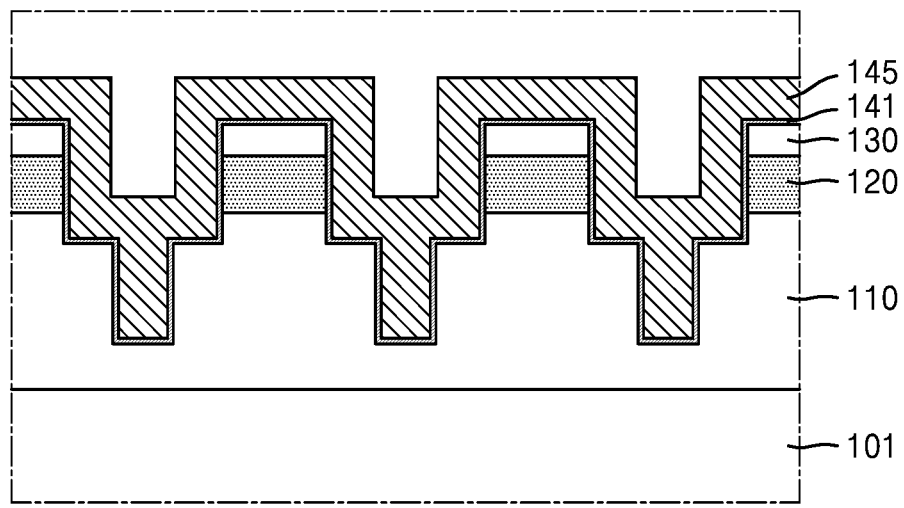

Referring to FIGS. 20 and 23, the barrier conductive layer 141 and the conductive layer 145 may be formed (P430).

The barrier conductive layer 141 may be provided by any one method of, for example, atomic layer deposition (ALD), chemical vapor deposition (CVD), plasma-enhanced CVD (PECVD), metal organic CVD (MOCVD), physical vapor deposition (PVD), reactive pulsed laser deposition, molecular beam epitaxy, and direct current (DC) magnetron sputtering.

The conductive layer 145 may be provided by an electroplating process, but is not limited thereto.

Figure 24:
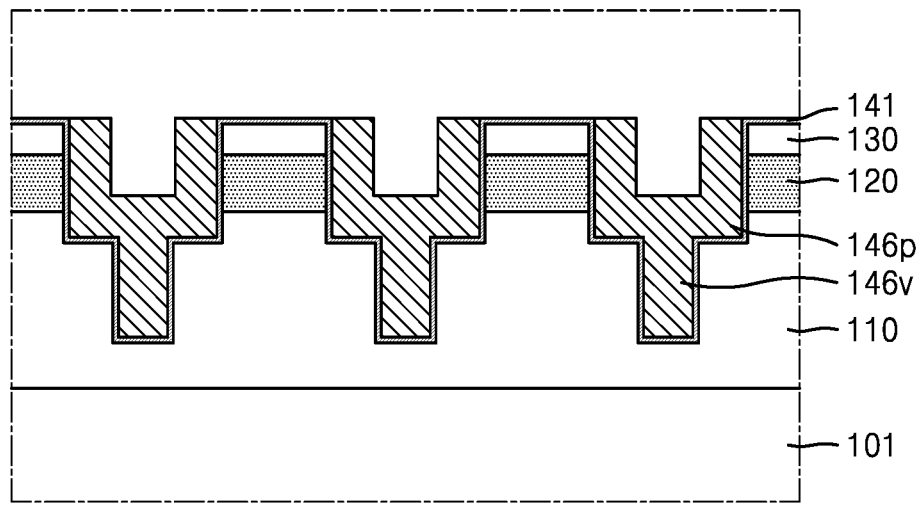

Referring to FIGS. 20, 23, and 24, the conductive patterns 146p and the conductive vias 146v may be formed (P440).

Forming the conductive patterns 146p and the conductive vias 146v may include removing the top portion of the conductive layer 145 by a CMP process. Accordingly, different portions from each other of the conductive layers 145 corresponding to the plurality of openings Op2 may be separated without substantial damage to the barrier conductive layer 141, and the plurality of conductive patterns 146p and the conductive vias 146v may be formed.

The conductive vias 146v may extend in a direction perpendicular to the top surface of the substrate 101, and the conductive patterns 146p may extend in a direction parallel with the top surface of the substrate 101. Accordingly, a contact area between the stacked conductive patterns of the substrates 101 may be secured, and thus the reliability of semiconductor device manufacturing may be improved.

Referring to FIGS. 20 and 25, the fourth insulating layer 150 may be formed (P450). Forming of the fourth insulating layer 150 may be substantially the same as described with reference to FIGS. 1 and 6.

Referring to FIGS. 20, 26A, and 26B, a portion of an edge portion of the substrate 101 may be removed (P460). Removal of a portion of the edge portion of the substrate 101 may be substantially the same as described with reference to FIGS. 1, 7A, and 7B.

Referring to FIGS. 20, 27A, and 27B, a CMP process may be performed (P470). Performing the CMP process may be substantially the same as described with reference to FIGS. 1 and 8. Top surfaces of the conductive patterns 146p may be exposed by performing the CMP process. The top surfaces of the conductive patterns 146p may be at the same level as the top surface of the second insulating layer 120.

Subsequently, the semiconductor stack SS may be formed (P480). Operation P480 may be substantially the same as operation P180 described with reference to FIGS. 1, 9A, and 9B.

Figure 28:
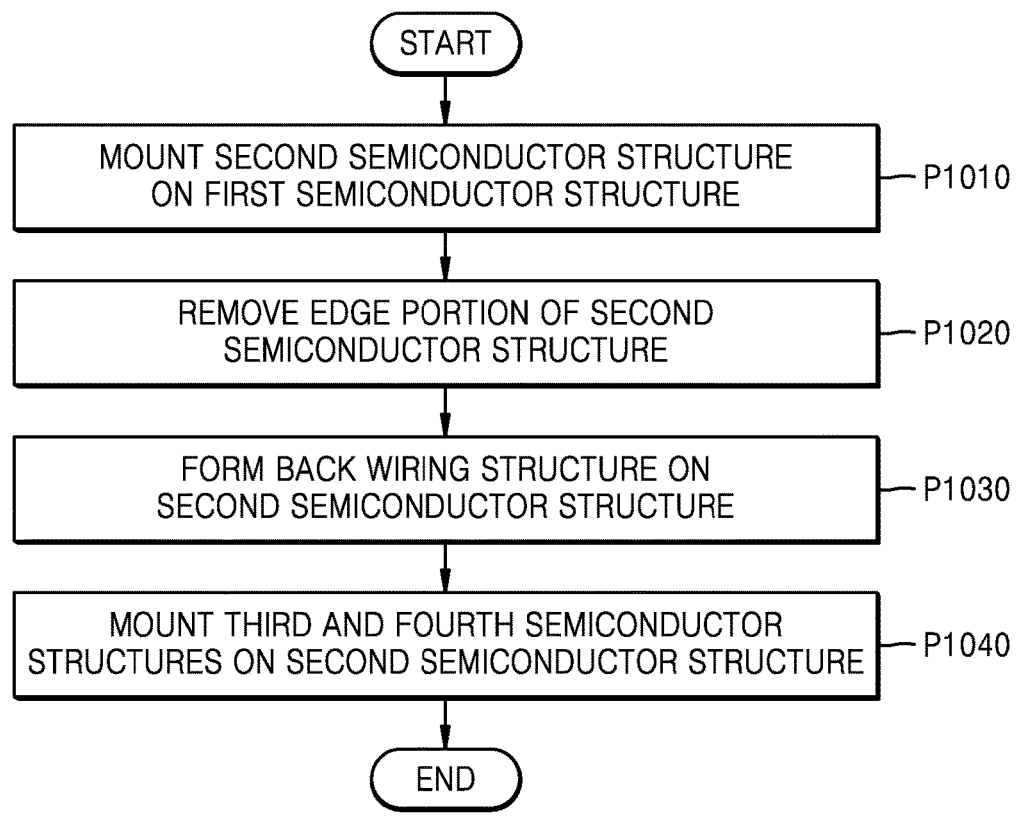
FIG. 28 is a flowchart of a method of manufacturing a semiconductor device, according to some embodiments.

FIG. 28 is a flowchart of a method of manufacturing a semiconductor device, according to some embodiments.

FIGS. 29 through 32 are cross-sectional views illustrating a method of manufacturing semiconductor structures (2, 3, and 4), according to some embodiments.

Figure 29:
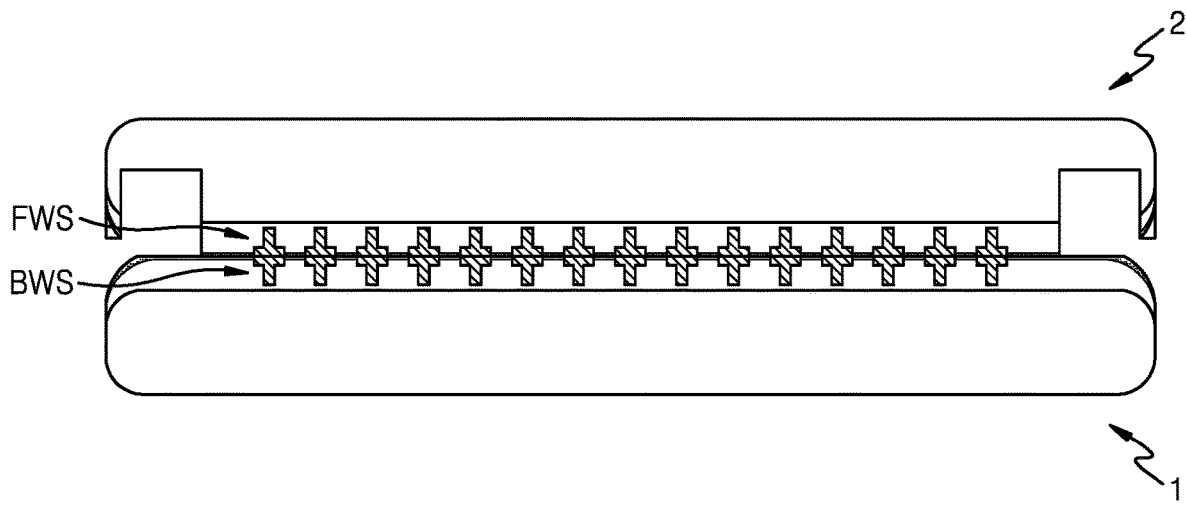
FIGS. 29 through 33 are cross-sectional views illustrating a method of manufacturing a semiconductor structure, according to some embodiments.

Referring to FIGS. 28 and 29, the second semiconductor structure 2 may be mounted on the first semiconductor structure 1 (P1010).

The first semiconductor structure 1 may include a front wiring structure FWS and a back wiring structure BWS. The front wiring structure FWS may be an external connection terminal, and may be, for example, a path to which signals, a power, and a ground voltage are applied from the outside to a semiconductor stack (refer to SS in FIG. 33) to be described later. The back wiring structure BWS may be provided for bonding and electrical connection with the second semiconductor structure 2.

The back wiring structure BWS of the first semiconductor structure 1 may include a conductive material. Since the edge trimming process is not performed on the first semiconductor structure 1, the back wiring structure BWS of the first semiconductor structure 1 may be formed by using a method different from that described with reference to FIGS. 20 through 27B. The front wiring structure FWS and the back wiring structure BWS of the first semiconductor structure 1 may be formed by, for example, a dual damascene process, but are not limited thereto.

The front wiring structure FWS included in the second semiconductor structure 2 may be formed by a series of processes described with reference to FIGS. 21 through 27B.

Figure 30:
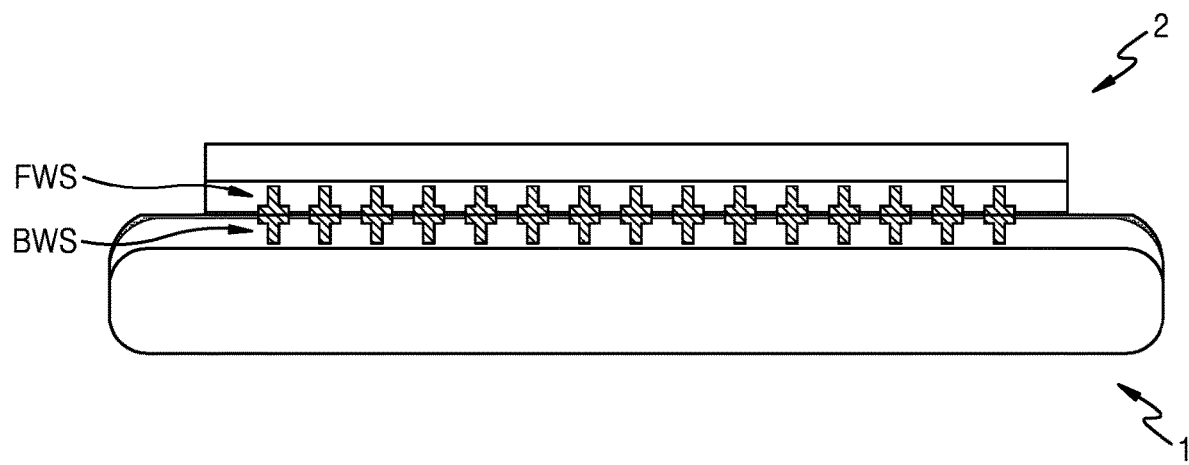

Referring to FIGS. 28 and 30, edge portions of the second semiconductor structure 2 may be removed (P1020).

Removal of the edge portions of the second semiconductor structure 2 may be performed by the back grinding process like described in FIG. 9A. For example, the back grinding process may remove one or more portions of the edge portions. As an example, the back grinding process may remove bottom and/or side portions of the edge portions that were not removed by edge trimming. In some embodiments, the back grinding process may completely remove the remainder of the edge portions.

Figure 31:
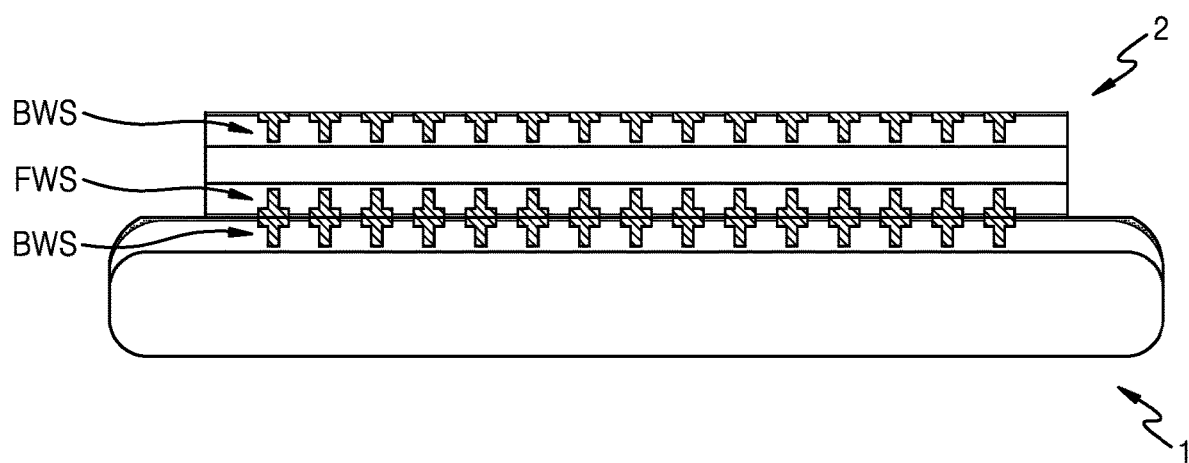

Referring to FIGS. 28 and 31, the back wiring structure BWS may be formed in the second semiconductor structure 2 (P1030).

The back wiring structure BWS of the second semiconductor structure 2 may be provided in a manner similar to that of the back wiring structure BWS of the first semiconductor structure 1.

Figure 32:
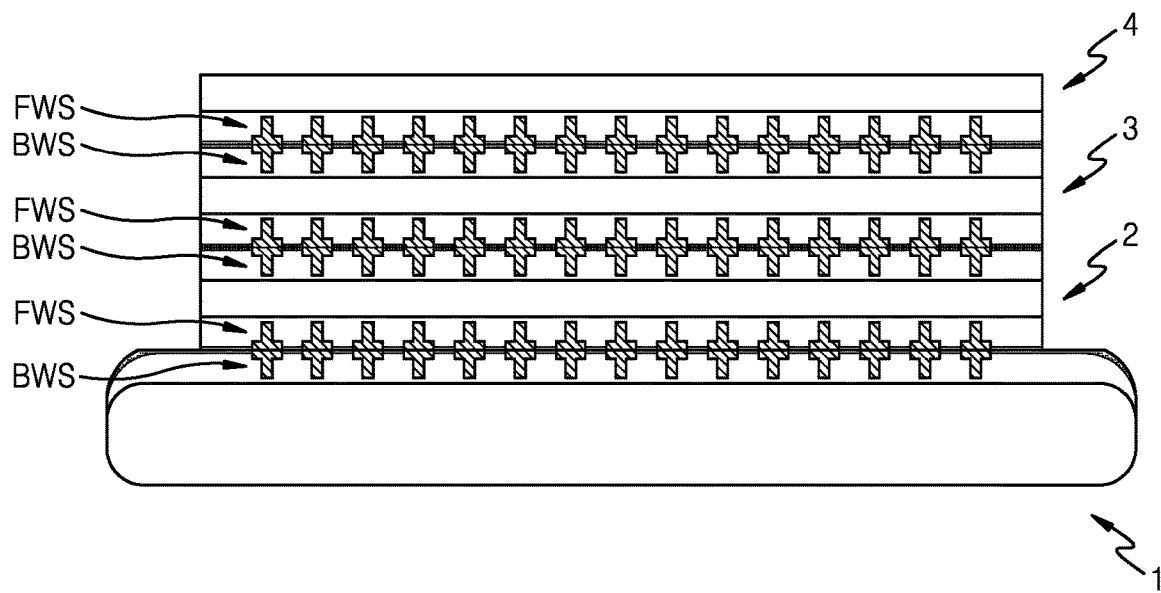

Referring to FIGS. 28 and 32, a third semiconductor structure 3 and a fourth semiconductor structure 4 may be mounted on the second semiconductor structure 2 (P1040).

The mounting of the third and fourth semiconductor structures 3 and 4 may be substantially the same as that of operations P1020 and P1030 for providing the second semiconductor structure 2, respectively. In this case, since the fourth semiconductor structure 4 is on an uppermost layer, the fourth semiconductor structure 4 may not include the back wiring structure BWS.

Figure 33:
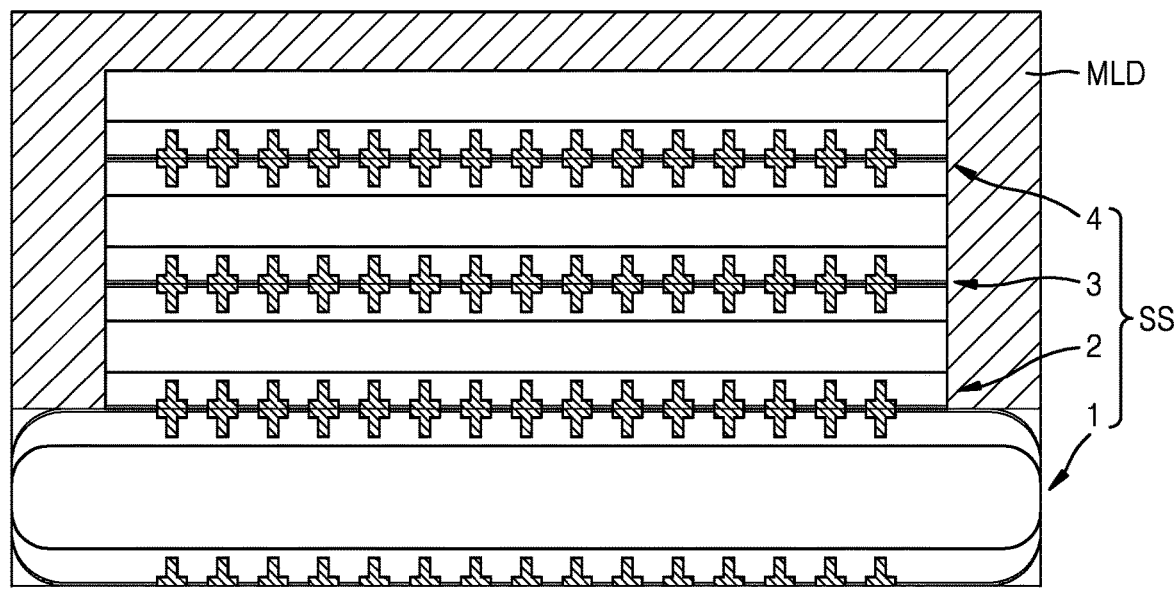

Referring to FIGS. 28 and 33, a molding layer MLD may be formed to cover the first through fourth semiconductor structures 1 through 4

The molding layer MLD may include, for example, an epoxy molding compound (EMC). According to some embodiments, the molding layer MLD may cover a top surface of the fourth semiconductor structure 4. In some embodiments, unlike the example illustrated in FIG. 33, a molding layer may not be formed on the top surface of the fourth semiconductor structure 4, and the top surface of the fourth semiconductor structure 4 may be exposed to the outside of the semiconductor stack SS.

Thereafter, by separating the semiconductor stack SS by a sawing process, individual chips may be formed.

While the inventive concept has been particularly shown and described with reference to embodiments thereof, it will be understood that various changes in form and details may be made therein without departing from the scope of the following claims.

What is claimed is:

1. A method of manufacturing a semiconductor device, the method comprising:
   sequentially forming first through third insulating layers on a substrate;
   forming an opening by etching the first through third insulating layers;
   forming a conductive layer in the opening;
   forming a fourth insulating layer in the opening after the forming of the conductive layer; and
   removing a portion of an edge region of the substrate after the forming of the fourth insulating layer,
   wherein a plurality of semiconductor devices are in or on the substrate before forming the opening.

2. The method of claim 1, further comprising cleaning the substrate by using an acid-base solution after the removing of the portion of the edge region of the substrate,
   wherein the conductive layer comprises a first of a plurality of conductive regions that are horizontally spaced apart from each other in the first through third insulating layers, and
   wherein, during the cleaning, the fourth insulating layer extends continuously from the first conductive region to a second and a third of the plurality of conductive regions.

3. The method of claim 2, wherein the cleaning of the substrate comprises removing a portion of the fourth insulating layer without exposing the first, second, and third of the plurality of conductive regions.

4. The method of claim 1, wherein the forming of the fourth insulating layer comprises forming a lowermost point of a top surface of the fourth insulating layer farther apart from the substrate than a top surface of the third insulating layer.

5. The method of claim 1, wherein the fourth insulating layer comprises a material that the second insulating layer comprises.

6. The method of claim 1, further comprising forming a conductive pattern by removing a portion of the conductive layer before the forming of the fourth insulating layer.

7. The method of claim 6, further comprising performing a chemical mechanical polishing (CMP) process to expose a top surface of the conductive pattern after the forming of the fourth insulating layer.

8. The method of claim 7, wherein a portion of the fourth insulating layer is simultaneously removed together with a portion of the second insulating layer by the CMP process.

9. The method of claim 7, wherein the CMP process is performed with a target to etch the second insulating layer by a predetermined amount.

10. The method of claim 1,
    wherein the conductive layer comprises a first of a plurality of conductive regions that are horizontally spaced apart from each other in the first through third insulating layers, and
    wherein, during the removing, the fourth insulating layer extends continuously from the first conductive region to a second and a third of the plurality of conductive regions.

11. A method of manufacturing a semiconductor device, the method comprising:
    sequentially forming first through third insulating layers on a first surface of a first substrate;
    forming a plurality of openings by etching the first through third insulating layers;
    conformally forming a barrier conductive layer on the first through third insulating layers after the forming of the plurality of openings;
    forming a conductive layer in the plurality of openings and in contact with the barrier conductive layer;
    forming a conductive pattern by removing a portion of the conductive layer;
    forming a fourth insulating layer on the conductive pattern and the barrier conductive layer such that the fourth insulating layer is in contact with the conductive pattern and the barrier conductive layer, and a top surface of the fourth insulating layer is farther apart from the first substrate than a top surface of the third insulating layer;
    removing a portion of an edge region of the first substrate and cleaning the first substrate;
    performing a chemical mechanical polishing (CMP) process to expose a top surface of the conductive pattern; and
    combining the first substrate with a second substrate.

12. The method of claim 11, wherein the fourth insulating layer comprises a material that the second insulating layer comprises.

13. The method of claim 11, wherein the fourth insulating layer comprises a different material from that of the second insulating layer.

14. The method of claim 11, wherein the cleaning of the first substrate comprises removing a top portion of the fourth insulating layer.

15. The method of claim 11, wherein, during the removing of the portion of the edge region of the first substrate, the conductive pattern is covered by the fourth insulating layer.

16. The method of claim 11, wherein the cleaning of the first substrate is performed by using a HNPA solution comprising hydrofluoric acid (HF), nitric acid ($HNO_3$), phosphoric acid ($H_3PO_4$), acetic acid ($CH_3COOH$), and water.

17. A method of manufacturing a semiconductor device, the method comprising:
    forming first through third insulating layers on a substrate;
    forming an opening by etching the first through third insulating layers;
    forming a conductive layer in the opening;
    forming a fourth insulating layer in the opening after the forming of the conductive layer;
    removing a portion of an edge region of the substrate after the forming of the fourth insulating layer; and
    cleaning the substrate after the removing of the portion of the edge region of the substrate,
    wherein a plurality of semiconductor devices are in or on the substrate before forming the opening.

18. The method of claim 17,
    wherein the cleaning of the substrate comprises using an acid-base solution,
    wherein the conductive layer comprises a first of a plurality of conductive regions that are horizontally spaced apart from each other in the first through third insulating layers, and
    wherein, during the cleaning, the fourth insulating layer extends continuously from the first conductive region to a second and a third of the plurality of conductive regions.

19. The method of claim 18, wherein the cleaning of the substrate comprises removing a portion of the fourth insulating layer without exposing the first, second, and third of the plurality of conductive regions.

20. The method of claim 17, wherein the forming of the fourth insulating layer comprises forming a lowermost point of a bottom surface of the fourth insulating layer farther apart from the substrate than a top surface of the first insulating layer.

* * * * *